United States Patent
Kokubo et al.

(10) Patent No.: US 7,109,069 B2
(45) Date of Patent: Sep. 19, 2006

(54) SEMICONDUCTOR DEVICE AND METHOD OF MANUFACTURING THE SAME

(75) Inventors: Chiho Kokubo, Tochigi (JP); Aiko Shiga, Atsugi (JP); Shunpei Yamazaki, Setagaya (JP); Hidekazu Miyairi, Atsugi (JP); Koji Dairiki, Atsugi (JP); Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 99 days.

(21) Appl. No.: 10/321,841

(22) Filed: Dec. 18, 2002

(65) Prior Publication Data

US 2003/0234395 A1 Dec. 25, 2003

(30) Foreign Application Priority Data

Dec. 21, 2001 (JP) .................................. 2001-390708

(51) Int. Cl.
*H01L 21/00* (2006.01)

(52) U.S. Cl. .................. 438/149; 438/150; 438/479; 438/487; 257/347

(58) Field of Classification Search ................ 438/149, 438/150, 479, 487, 517; 257/347
See application file for complete search history.

(56) References Cited

U.S. PATENT DOCUMENTS

| | | |
|---|---|---|
| 4,330,363 A | 5/1982 | Biegesen et al. |
| 4,388,145 A | 6/1983 | Hawkins et al. |

(Continued)

FOREIGN PATENT DOCUMENTS

| | | |
|---|---|---|
| EP | 88004 A2 | 9/1983 |
| EP | 1 049 144 A1 | 11/2000 |

(Continued)

OTHER PUBLICATIONS

"Ultra–high Performance Poly–Si TFTs on a Glass by a Stable Scanning CW Laser Lateral Crystallization" A. Hara et al. AMLCD'01 Tech. Dig., 2001, pp. 227–230.

(Continued)

*Primary Examiner*—George Eckert
*Assistant Examiner*—Edgardo Ortiz
(74) *Attorney, Agent, or Firm*—Nixon Peabody LLP; Jeffrey L. Costellia

(57) ABSTRACT

In a conventional method of crystallization using a laser beam, variance (or dispersion) in a TFT characteristic becomes large, which causes various functions of a semiconductor device comprising TFTs as components of its electronic circuit to be restrained.

A first shape of semiconductor region having on its one side a plurality of sharp convex top-end portions is formed first and a continuous wave laser beam is used for radiation from the above region so as to crystallize the first shape of semiconductor region. A continuous wave laser beam condensed in one or plural lines is used for the laser beam. The first shape of semiconductor region is etched to form a second shape of semiconductor region in which a channel forming region and a source and drain region are formed. The second shape of semiconductor region is disposed so that a channel forming range would be formed on respective crystal regions extending from the plurality of convex end portions. A semiconductor region adjacent to the channel forming region is eliminated.

31 Claims, 21 Drawing Sheets

U.S. PATENT DOCUMENTS

| | | | |
|---|---|---|---|
| 4,554,823 A * | 11/1985 | Lilley | 73/116 |
| 4,780,590 A | 10/1988 | Griner et al. | |
| 5,214,001 A * | 5/1993 | Ipposhi et al. | 438/479 |
| 5,225,886 A | 7/1993 | Koizumi et al. | |
| 5,632,915 A | 5/1997 | Schnetzer et al. | |
| 5,643,826 A | 7/1997 | Ohtani et al. | |
| 5,708,252 A | 1/1998 | Shinohara et al. | |
| 5,712,191 A | 1/1998 | Nakajima et al. | |
| 5,854,803 A | 12/1998 | Yamazaki et al. | |
| 5,937,282 A | 8/1999 | Nakajima et al. | |
| 5,986,306 A | 11/1999 | Nakajima et al. | |
| 6,071,765 A * | 6/2000 | Noguchi et al. | 438/166 |
| 6,210,996 B1 | 4/2001 | Yamazaki et al. | |
| 6,242,289 B1 | 6/2001 | Nakajima et al. | |
| 6,365,933 B1 | 4/2002 | Yamazaki et al. | |
| 6,449,123 B1 | 9/2002 | Tsujimoto et al. | |
| 6,469,729 B1 | 10/2002 | Ryan | |
| 6,479,329 B1 | 11/2002 | Nakajima et al. | |
| 6,599,788 B1 * | 7/2003 | Kawasaki et al. | 438/158 |
| 6,677,222 B1 | 1/2004 | Mishima et al. | |
| 6,700,096 B1 | 3/2004 | Yamazaki et al. | |
| 6,730,550 B1 | 5/2004 | Yamazaki et al. | |
| 6,753,212 B1 | 6/2004 | Yamazaki et al. | |
| 2001/0019861 A1 | 9/2001 | Yamazaki et al. | |
| 2001/0038127 A1 | 11/2001 | Yamazaki et al. | |
| 2003/0047732 A1 | 3/2003 | Yamazaki et al. | |
| 2003/0059990 A1 | 3/2003 | Yamazaki | |
| 2003/0075733 A1 | 4/2003 | Yamazaki et al. | |
| 2003/0148594 A1 | 8/2003 | Yamazaki et al. | |
| 2003/0153182 A1 | 8/2003 | Yamazaki et al. | |
| 2003/0153999 A1 | 8/2003 | Miyanaga et al. | |
| 2003/0171837 A1 | 9/2003 | Yamazaki et al. | |
| 2003/0211714 A1 | 11/2003 | Yamazaki et al. | |
| 2003/0215973 A1 | 11/2003 | Yamazaki et al. | |
| 2003/0228723 A1 | 12/2003 | Yamazaki et al. | |
| 2003/0235971 A1 | 12/2003 | Yamazaki et al. | |
| 2004/0106237 A1 | 6/2004 | Yamazaki | |
| 2004/0132266 A1 | 7/2004 | Yamazaki et al. | |

FOREIGN PATENT DOCUMENTS

| | | |
|---|---|---|
| JP | 60-161396 A | 8/1985 |
| JP | 62-104117 | 5/1987 |
| JP | 2-181419 | 7/1990 |
| JP | 07-130652 | 5/1995 |
| JP | 08-078329 | 3/1996 |
| JP | 8-195357 | 7/1996 |
| JP | 09-270393 | 10/1997 |
| JP | 10-135468 | 5/1998 |
| JP | 10-135469 | 5/1998 |
| JP | 11-354463 | 12/1999 |
| JP | 2000-068520 | 3/2000 |
| JP | 2001-144027 | 5/2001 |

OTHER PUBLICATIONS

Hara, Akito et al., *"High Performance Poly–Si TFT's on a Glass by a Stable Scanning CW Laser Lateral Crystallization"*, IEDM '01 Technical Digest of International Electron Devices Meeting, Jan. 1, 2001, pp. 747–750.

* cited by examiner

Wss=Wst+2Wbc

W = Wst × 4

L=Ls × 3

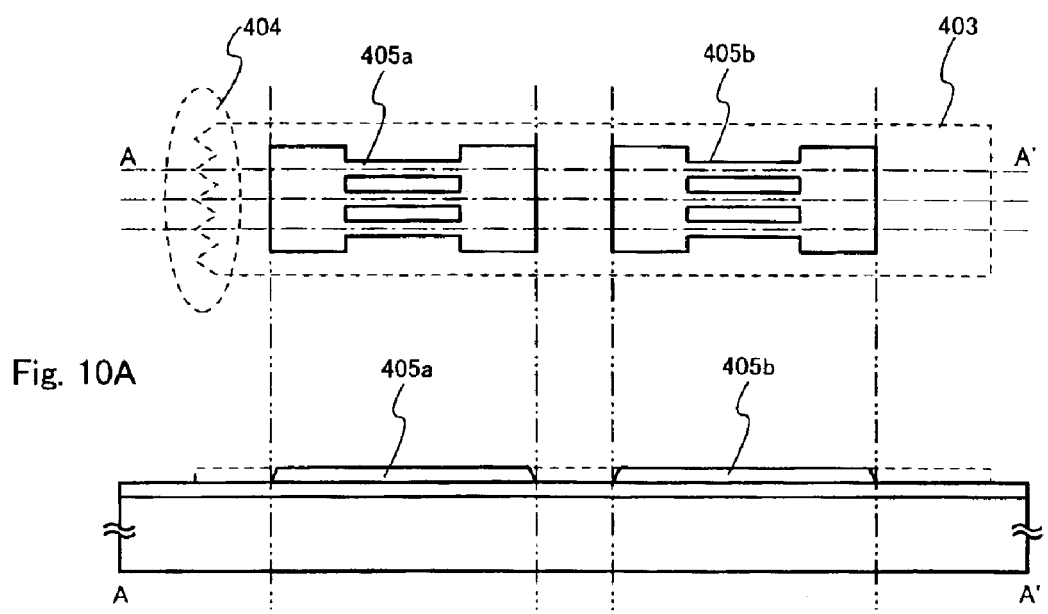
Fig. 10A
Fig. 10B
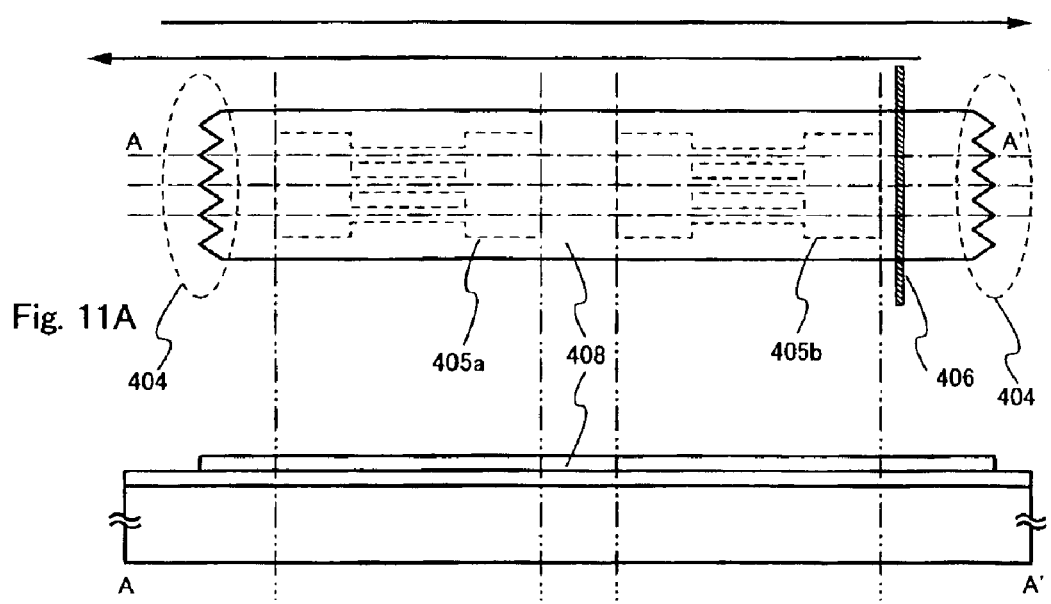
Fig. 11A
Fig. 11B

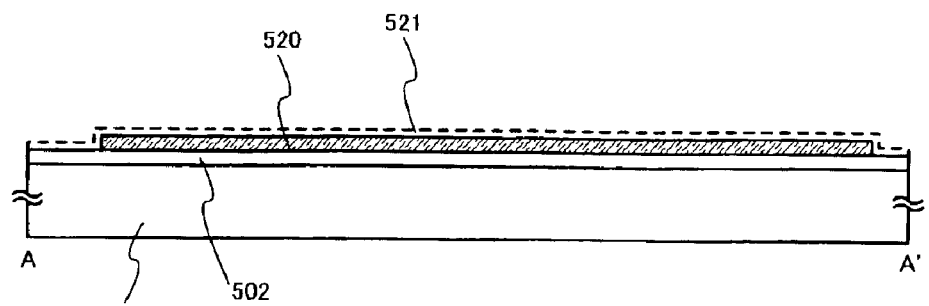
Fig. 17A
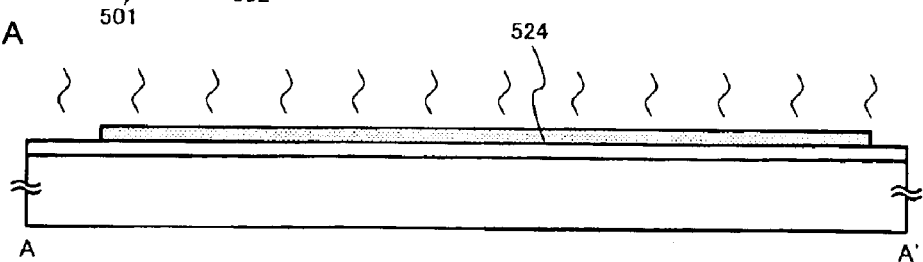
Fig. 17B
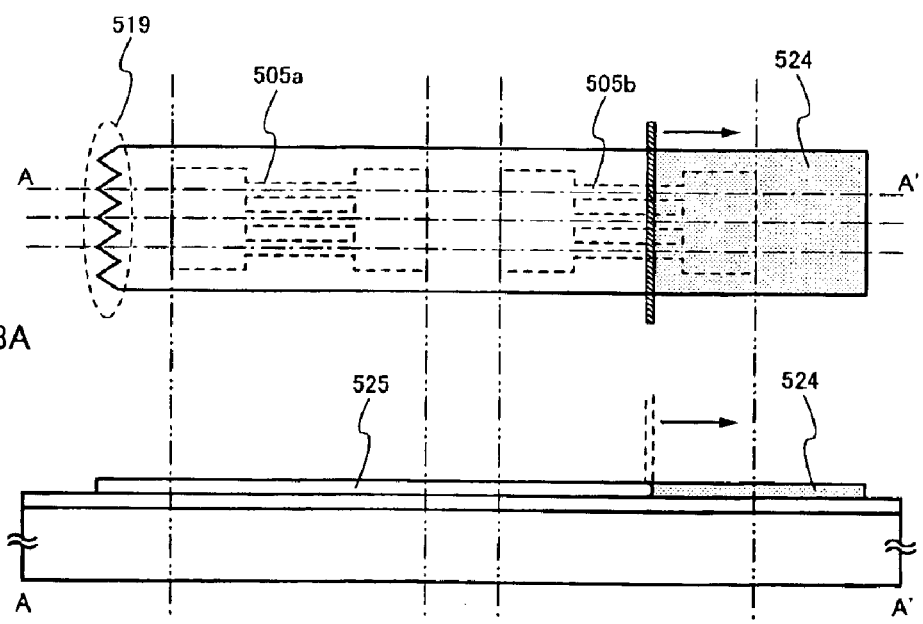
Fig. 18A
Fig. 18B

SEMICONDUCTOR DEVICE AND METHOD OF MANUFACTURING THE SAME

BACKGROUND OF THE INVENTION

1. Field of the Invention

The present invention relates to a semiconductor device using a crystalline semiconductor film crystallized by radiating an amorphous semiconductor film with a laser beam and a method of manufacturing the same.

2. Description of the Related Art

There has been a known technology for crystallizing an amorphous semiconductor film formed on a substrate such as glass by means of a laser process. The laser process means a method of recrystallizing a damaged or amorphous film formed on a semiconductor substrate or a semiconductor film, a method of crystallizing an amorphous semiconductor film formed on an insulating surface or a method of improving crystallinity of a semiconductor film (crystalline semiconductor film) having a crystalline structure. A gas laser represented by an excimer laser or a solid laser represented by a YGA laser is usually used as a laser oscillator device used for the laser process.

A feature of using a laser beam is in that a laser beam is used for radiation and an area absorbing an energy of the laser beam can only be heated selectively, different from a case of a heating process using radiating heating or conducting heating. For example, in a laser process using an excimer laser oscillator device, a process of crystallization or activation of a semiconductor film is achieved by heating a semiconductor film selectively and locally with almost no heat-damage to a glass substrate.

As an example of the laser process, there is a known method of processing a beam linearly by means of an optical system to use the beam for radiation like a laser processing device disclosed in Japanese Patent Laid-Open No. 8-195357. Further, a method of crystallization with a solid laser oscillator device such as an Nd:YVO$_4$ laser is disclosed in Japanese Patent Laid-Open No. 2001-144027. This document discloses that the second higher harmonic of a laser beam used for radiation from the solid laser oscillator device allows the crystalline semiconductor film to have a larger grain size than conventional cases.

Especially, application to a thin film transistor (hereinafter referred to as a TFT) in a method of crystallization using a continuous wave solid laser oscillator device is reported in "Ultra-high Performance Poly-Si TFTs on a Glass by a Stable Scanning CW laser Lateral Crystallization", A. Hara, F. Takeuchi, M. Takei, K. Yoshino, K. Suga and N. Sasaki, AMLCD '01 Tech. Dig., 2001, pp.227–230. This document discloses an example of a method of producing a TFT with a polycrystalline silicon film crystallized by means of the second higher harmonic of a solid continuous oscillator laser (YVO$_4$) for diode excitation.

SUMMARY OF THE INVENTION

When a continuous wave laser beam is used for radiation to crystallize an amorphous semiconductor film formed on an insulating surface, a crystal having a comparatively large grain size can be formed even on a glass substrate. It has not been possible, however, to orient all surfaces of a substrate to a particular single crystal orientation.

Almost all part of crystallization of an amorphous semiconductor film by means of a laser beam grows through a melt-solidification process regardless of pulse oscillation or continuous wave. In further detail, there are two stages considered: a stage of producing a crystal core; and a stage of crystal growth from the core. In most conventional methods, however, it is not possible to control producing position and density of a crystal core, so that crystallization has been performed by means of a naturally produced crystal core. Therefore, there is a problem that a crystal cannot be grown with a particular orientation. Consequently, grains of crystal are formed in any positions in a plane of a glass substrate and are in only small size such as around 0.2 to 0.5 µm.

Usually, a large number of defects are produced in a grain boundary. The defects are considered to be a factor confining mobility of field effect of a TFT. Moreover, the crystal orientation is random due to dependence on a crystal core produced at any time, so that the crystalline semiconductor cannot be oriented in a line.

In a laser process using a pulse width oscillation laser oscillator device, crystal growth caused by a crystal core is dominant, and thereby, a grain size cannot be enlarged in practice. Concretely, it is impossible to form a crystal in a channel forming area of a TFT, the crystal not existing in a grain boundary and being possible to be considered a substantially single crystal in a view of element level. Not only a grain boundary but also a defect or displacement produced is caused by contraction of a volume of a film due to thickening in accordance with crystallization.

On the other hand, a method of crystallization with a continuous wave laser beam scanning to perform melt-solidification is regarded as a method close to a zone melting method in which continuous crystal growth allows a grain size to be enlarged. There is, however, a problem that quality of a crystal to be obtained depends on crystallinity in a range, which is a first seed of crystallization. Concretely, crystal growth expects a crystal core accidentally produced.

As described above, in a conventional method of crystallization using a laser beam, variance (or dispersion) in a TFT characteristic becomes large, which causes various functions of a semiconductor device comprising TFTs as components of its electronic circuit to be restrained.

In view of the above problems, an object of the invention is to improve crystallinity of a crystalline semiconductor film formed by crystallizing an amorphous semiconductor film so as to provide a TFT capable of operating at higher speed.

In order to solve the above problem, according to the invention, a first shape of semiconductor region is formed in an island configuration on an insulating surface to be crystallized by means of a continuous wave laser beam, and then, a second shape of semiconductor region is formed so that an inner part of the first shape of semiconductor region would be used for an active layer such as a TFT. For the purpose of reducing dispersion of a characteristic of an element produced by means of a crystalline semiconductor film, the crystallinity of an active region decisive for the characteristic of the element should be homogenized. The invention, therefore, devised a configuration of a region, which would be an origin of crystallization in the first shape of semiconductor region.

Concretely, a first shape of semiconductor region having on its one side a plurality of sharp convex top-end portions (projections) is formed first and a continuous wave laser beam is used for radiation from the above region so as to crystallize or improve crystallinity of the first shape of semiconductor region along a scanning direction of the laser beam. Preferably, a continuous wave laser beam condensed in one or plural lines on a radiation surface is used for the laser beam. Then, the first shape of semiconductor region is etched to form on its inner side a second shape of semiconductor region on which a channel forming region and a source and drain region are formed. The second shape of semiconductor region has a plurality of oblong semiconductor regions so that a channel forming range would be formed on respective crystal regions extending from the plurality of convex end portions, and is etching-processed by means of a photoetching method so that a semiconductor region adjacent to the channel forming region would be eliminated. That is to say, a first shape of semiconductor region in which a plurality of semiconductor regions having on its one side a sharp convex top-end portion is disposed in parallel is formed from a semiconductor film formed on an insulating surface, and a continuous wave laser beam is used for radiation from the above first shape of semiconductor region so as to crystallize or improve crystallinity of the first shape of semiconductor region along a scanning route of the laser beam.

The continuous wave laser beam to be condensed in a line preferably has strength distribution in which an energy density distribution is even in a longitudinal direction. In a lateral direction, any distribution such as Gauss distribution, for example, is available. In a laser process, scanning is performed in a direction crossing the longitudinal direction of a continuous wave laser beam to be condensed in a line. This allows crystals to grow extending in parallel to the scanning direction since the strength distribution is even in a longitudinal direction. Namely, energy density distribution uneven in a longitudinal direction causes temperature inclination, so that crystals extend in accordance with the inclination or disordered crystals would be formed.

It is possible to use a rectangular beam solid laser oscillator device as a light source of a continuous wave laser beam, and typically, to employ a slab laser oscillator device.

Intervals between adjacent oblong semiconductor regions in the second shape of semiconductor regions are preferably twice or more the length in a channel width direction of the above semiconductor region and 0.5 to 1.0 µm in view of crystal growth. In this oblong semiconductor region, a low density drain region and electrodes to which common potential is applied through an insulating film is formed to provide a channel forming region.

Thus, a TFT provided in a second shape of semiconductor region formed after a first shape of semiconductor region is crystallized or improved in crystallinity has a crystalline semiconductor film integrally formed with a plurality of rectangular semiconductor regions provided in parallel and a crystalline semiconductor film integrally formed with a pair of semiconductor regions connected to the above rectangular semiconductor region. In the plurality of rectangular semiconductor regions, a channel forming region is formed with electrodes crossing through an insulating film and crystals extend along a direction of the channel length.

Otherwise, the TFT provided with a second shape of semiconductor region has a crystalline semiconductor film integrally formed with a semiconductor region in which a plurality of rectangular semiconductor regions provided in parallel are connected in series and a pair of semiconductor regions connected to both ends of the rectangular semiconductor region. In the plurality of rectangular semiconductor regions, a channel forming region is formed with electrodes crossing through an insulating film and crystals are provided extending along a direction of the channel length.

Crystals in the rectangular semiconductor region provided with a channel forming region extend parallel to the channel length direction and is characterized in that the crystal orientation aligns. Each of the plurality of rectangular semiconductor regions is provided with an interval twice or more the length in the channel width direction thereof.

That is, a region provided with a channel forming area for a TFT in a second shape of semiconductor region is provided so as to be formed with good crystals extending from a plurality of sharp convex top-end portions in one end portion of the first shape pf semiconductor region. Alternatively, the region provided with a channel forming area is partly etched to in order to prevent a grain boundary extended from the concave portion or a distortion-accumulated crystal from overlapping a channel forming region.

In accordance with such a structure, a plurality of rectangular semiconductor regions are provided in parallel to form a transistor, so that dispersion of a characteristic between elements can be made small. Further, using only good crystals can improve mobility of field effect.

The word of an amorphous semiconductor film according to the invention is used in a narrow sense and means not only a semiconductor film having a completely amorphous structure but also a so-called microcrystalline semiconductor film which contains microcrystalline grains and a semiconductor film locally including a crystalline structure. An amorphous silicon film is used typically, as well as an amorphous silicon germanium film and an amorphous silicon carbide film.

BRIEF DESCRIPTION OF THE DRAWINGS

Other features and advantages of the present invention will appear more clearly upon reading the following detailed description, made with reference to the annexed drawings in which:

FIGS. 10A and 10B show a top view and a cross-sectional view illustrating a crystallizing method according to the invention;

FIGS. 11A and 11B show a top view and a cross-sectional view illustrating a crystallizing method according to the invention;

FIGS. 17A and 17B show cross-sectional views illustrating a crystallizing method according to the invention;

FIGS. 18A and 18B show a top view and a cross-sectional view illustrating a crystallizing method according to the invention;

DETAILED DESCRIPTION OF THE INVENTION

Figure 1A:
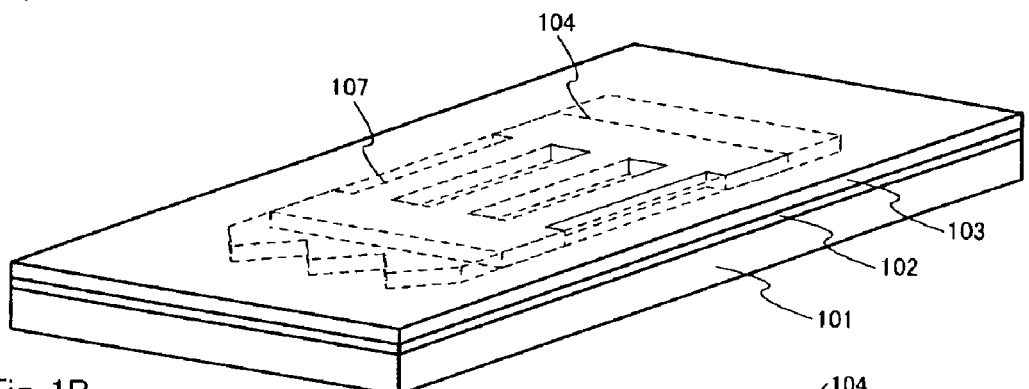
FIGS. 1A to 1C illustrate a concept of a method of manufacturing a semiconductor device according to the invention.

Now a mode for carrying out the invention will be described with reference to drawings. A perspective view of FIG. 1A shows a blocking layer 102 and an amorphous semiconductor film 103 formed on a substrate 101. The amorphous semiconductor film can be made of silicon or a compound or an alloy of silicon and germanium or of silicon and carbon. Silicon is most suitable material for the film among the above.

Figure 1B:
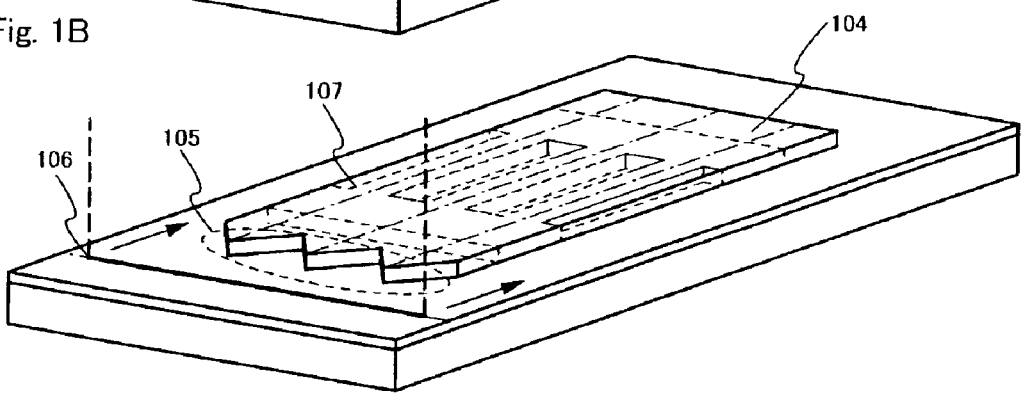

A mask pattern is formed on the amorphous semiconductor film 103 to form a first shape of semiconductor region 104 as shown in FIG. 1B. Inside of the first shape of semiconductor region 104, a second shape of semiconductor region 107 (shown in dotted lines) forming a channel forming region and a source and drain region of a TFT is formed as shown in the dotted lines. The second shape of semiconductor region 107 is formed inside the first shape of semiconductor region 104 so as not to extend to the end thereof.

The fist shape of semiconductor region 104 can have any outline as long as it is provided in a region 105 at its end with a plurality of sharp convex top-end portions. An angle of the convex top-end portion is preferably 90 degrees±30 degrees.

Scanning is performed by means of a continuous wave laser beam 106 in a single direction from the region 105 at one end of the first semiconductor region 104 toward the other end (a direction shown by an arrow in the drawing) to cause crystallization. It is also possible to carry out return scanning in a direction reverse to the original scanning. A laser beam to be used may preferably have strength dispersion such that there is an even region in a longitudinal direction while it disperses in a lateral direction. As a laser oscillator device used for a light source, employed a rectangular beam solid laser oscillator device, most preferably, a slab laser oscillator device. Alternatively, it is possible to employ a solid laser oscillator device using a crystal, which consists of a crystal such as YAG, $YVO_4$, YLF and $YAlO_3$ doped with Nd, Tm or Ho, in combination with a slab structure amplifier.

As slab materials, may be used a crystal such as Nd:YAG, Nd:GGG (gadolinium gallium garnet) and Nd:GSGG (gadolinium scandium gallium garnet). A laser beam progresses through the plate-shaped laser medium in a zigzag light path, repeating total reflection.

A wavelength of a continuous wave laser beam is preferably 400 to 700 nm in view of an optical absorption coefficient of an amorphous semiconductor film. A light in such a waveband can be obtained by taking second and third harmonics of a fundamental wave by means of a wavelength converting element. As the wavelength converting element, may be used ADP (ammonium dihydrogenphosphate), $Ba_2Nanb_5O_{15}$ (barium sodium niobate), CdSe (cadmium selenide), KDP (potassium dihydrogenphosphate), $LiNbO_3$ (lithium niobate), Se, Te, LBO, BBO and KB5. LBO is especially preferable to be used. In a typical example, a second harmonic (532 nm) of an $Nd:YVO_4$ laser oscillator device (a fundamental wave of 1064 nm) is used. A laser oscillation mode is in a single mode, which is a $TEM_{00}$ mode.

Silicon, which is selected as most suitable material, has an absorption coefficient between $10^3$ and $10^4$ $cm^{-1}$ in a visible light range. Therefore, in order to crystallize a substrate having a high visible light transmittance such as glass and the first shape of semiconductor region 104 formed into 30 to 200 nm thickness by means of silicon, radiation with light in a visible light range of a wavelength between 400 and 700 nm can selectively heat the semiconductor region to perform crystallization without damaging the underlying blocking layer 102. Concretely, a penetration depth of a light beam having a wavelength of 532 nm is about 100 nm to 1000 nm for an amorphous silicon film and can completely reach the inside of the first shape of semiconductor region 104 formed into 30 to 200 nm thickness. That is, heating from the inside of the semiconductor film is possible to evenly heat almost all of the semiconductor region in a radiation range of a laser beam.

A direction of laser beam radiation may be from a surface side of the substrate 101 on which the first shape of semiconductor region 104 is formed, as shown in FIG. 1B, or from a side of the substrate 101 in the case of translucent material made of glass or quartz. The shape of a laser beam on the radiation surface can be elliptic, rectangular and so or and is not specifically limited. It is, however, preferably a longer line than the length of a side of the first shape of semiconductor region 104 dividedly formed into islands. The line here has a ratio of a longitudinal length to a lateral length, which is 1 to 10 or more.

An outline of the first shape of semiconductor region 104 shown in FIG. 1B is characterized by a plurality of sharp convex top-end portions formed in a region 105 at an end, the region 105 becoming a seed of a crystal (the region is referred to as a seed region hereinafter). Radiation with a continuous wave laser beam from this region enables a crystal to grow in parallel with along a scanning direction.

In the crystal growth, a crystal first formed in a seed region becomes a core. The crystal in the seed region, which is also referred to as a seed crystal, may be accidentally formed or may be a crystal having an intentionally determined crystal orientation by adding a catalyst element or a specific element. In either event, the sharp top-end outline confines core growth of a crystal to have an effect of reducing core generating density as well as confining orientation of a crystal, so that a crystal having a specific orientation can be grown.

On the other hand, a crystal extending from a concave portion formed between convex portions disorders orientation and retards growth of a good crystal due to mutual interference of crystals growing from the both ends. That is to say, simultaneous growth on the basis of a plurality of crystal cores and its mutual interference cause growth of a grain boundary or distortion-accumulated crystal.

Figure 1C:
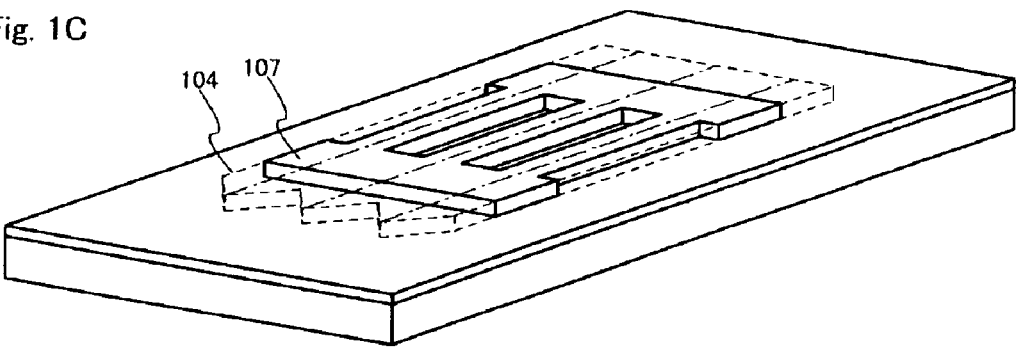

Then, a second shape of semiconductor region 107 is formed by etching as shown in FIG. 1C. A region for forming a channel forming region of a TFT in the second shape of semiconductor region 107 is arranged so as to consist of a crystal extending from a plurality of sharp convex top-ends, that is, a seed region, in the region 105 at an end. It may be etched, alternatively, to eliminate a portion corresponding to a concave portion in order to prevent a grain boundary extended from the concave portion or a distortion-accumulated crystal from overlapping a channel forming region.

Thus, the second shape of semiconductor region 107 can be considered to be in an outline formed into one body by a plurality of rectangular semiconductor regions provided in parallel and a pair of semiconductor regions continuously connected to the rectangular semiconductor regions. In the respective plural rectangular semiconductor regions, providing electrodes crossing them through an insulating film can form a channel forming region. The second shape of semiconductor region 107 can be considered to be in a configuration formed into one body by a plurality of rectangular semiconductor regions disposed in parallel continuously connected in series and a pair of semiconductor regions continuously connected to the both ends of the rectangular semiconductor regions. The respective plural rectangular semiconductor regions are provided with an interval twice or more the length in a channel width direction of the above semiconductor region. Further, the plural rectangular semiconductor regions are characterized in that they extend in a direction parallel to the channel length direction or that a crystal orientation is aligned in the channel forming region.

Figure 2:
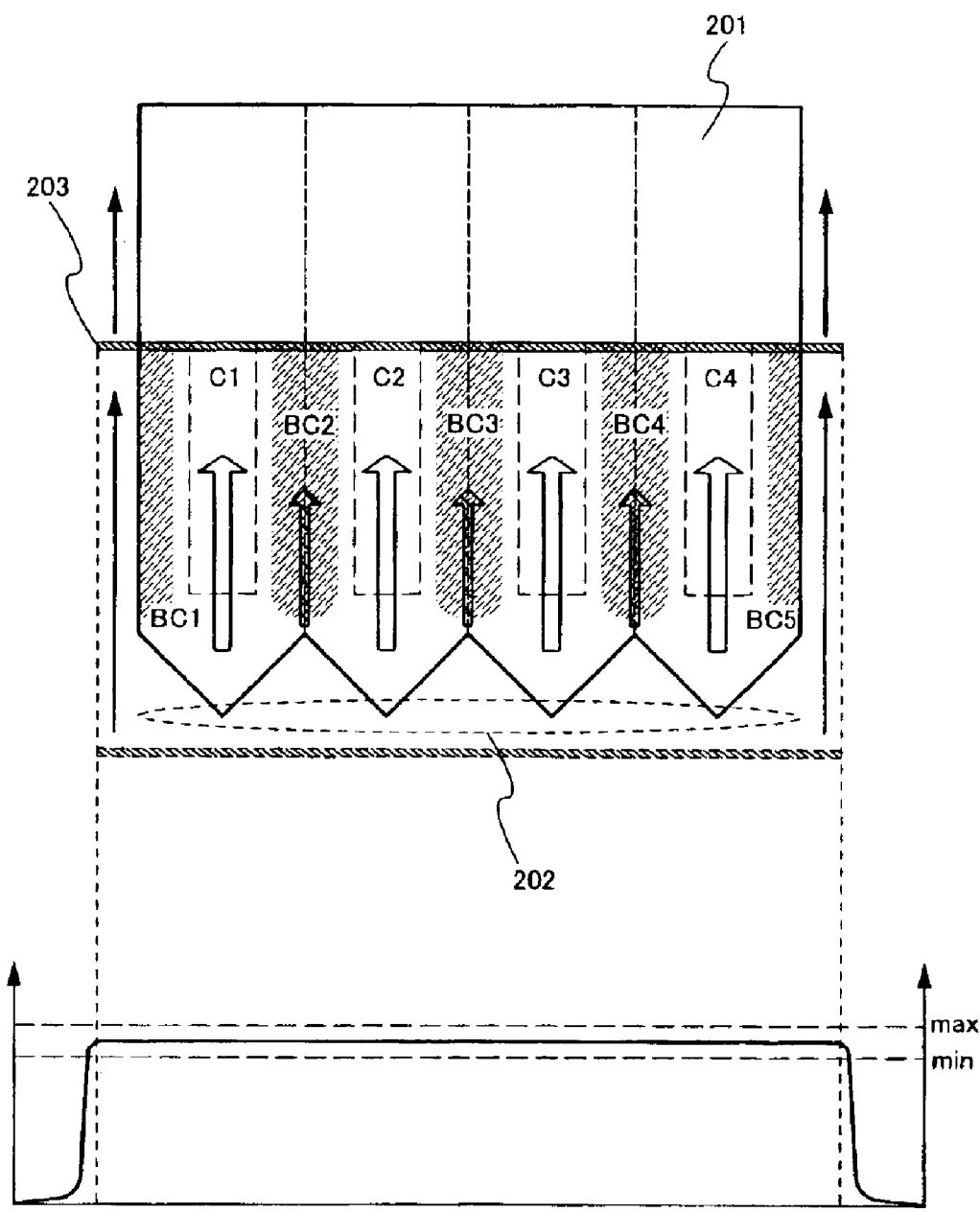
FIG. 2 illustrates details of a crystallization process according to the invention.
Figure 3:
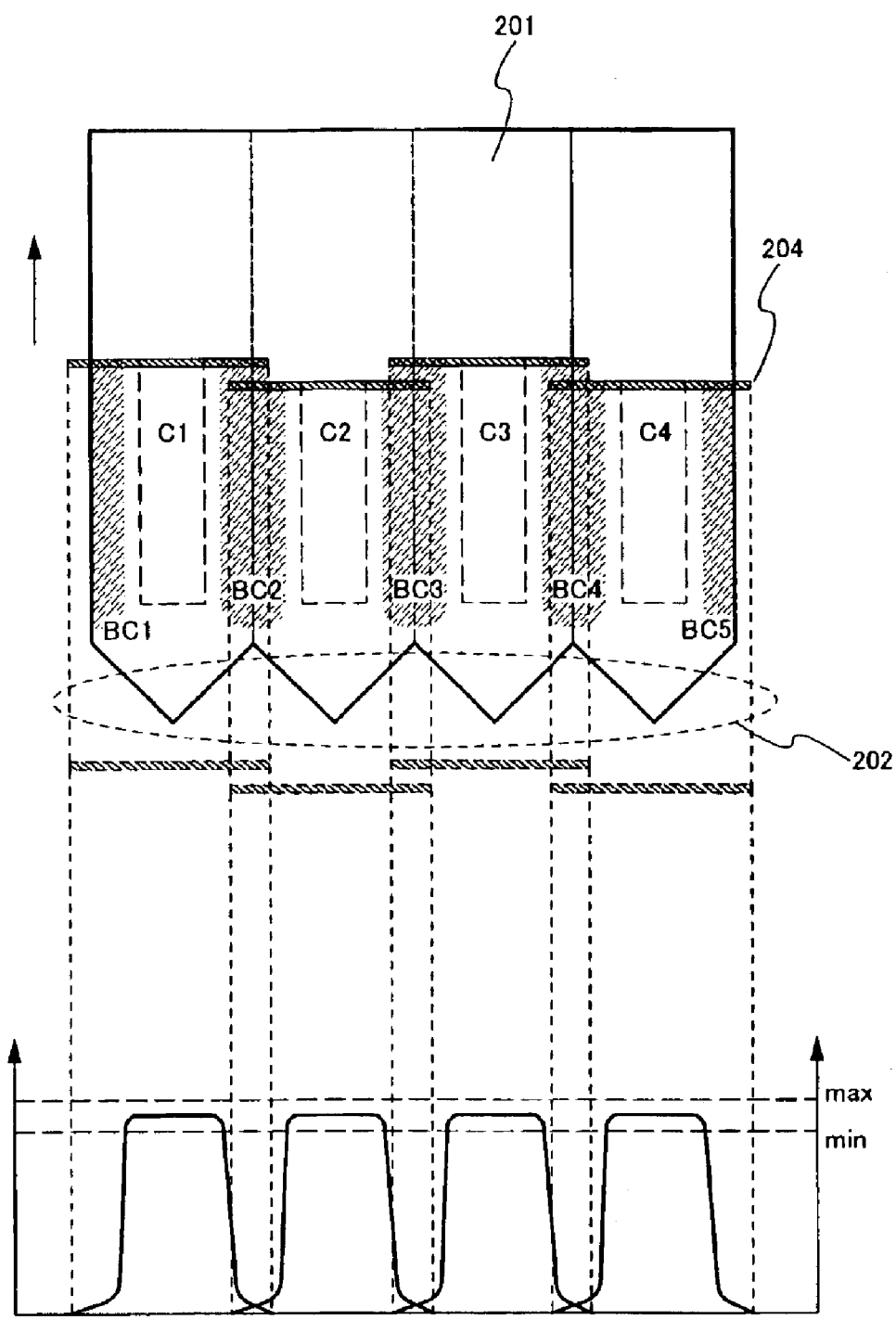
FIG. 3 illustrates details of a crystallization process according to the invention.

FIG. 2 shows a top view of the first shape of semiconductor region. In crystallization, scanning in a single direction with a linearly-condensed continuous wave laser beam 203 from a side on which a convex end (seed region) 202 formed in the first shape of semiconductor region 201 is formed serves for crystal growth or improvement in crystallinity. In the crystallization, a laser beam is continuously oscillated and a melting region is constantly retained, so that continuous crystals can be grown. The shape of a laser beam on the radiation surface can be elliptic or rectangular and is not specifically limited. It is, however, preferably a longer line than the length of a side of the first shape of semiconductor region 201. A laser beam to be used preferably has strength dispersion, which has uniformity within ±10% in a longitudinal direction.

The crystal growth progresses from the both of a convex end (seed region) 202 and a concave portion therebetween. Core generation of a crystal from the convex end (seed region) 202 is confined due to its sharp shape, so that there would be an effect of reducing core generation density and of confining crystal orientation, which can grow a crystal having a specific orientation (a region from C1 to C4). On the other hand, a crystal extending from the concave portion formed between the convex portions simultaneously grows on the basis of a plurality of crystal cores and mutual interference thereof leads growth of a grain boundary or distortion-accumulated crystal (a region from BC1 to BC5).

A continuous wave laser beam for radiation is not limited to a single linear laser beam, and a plurality of partially overlapping continuous wave laser beams 204 can be used for radiation to carry out crystallization equally.

Figure 4:
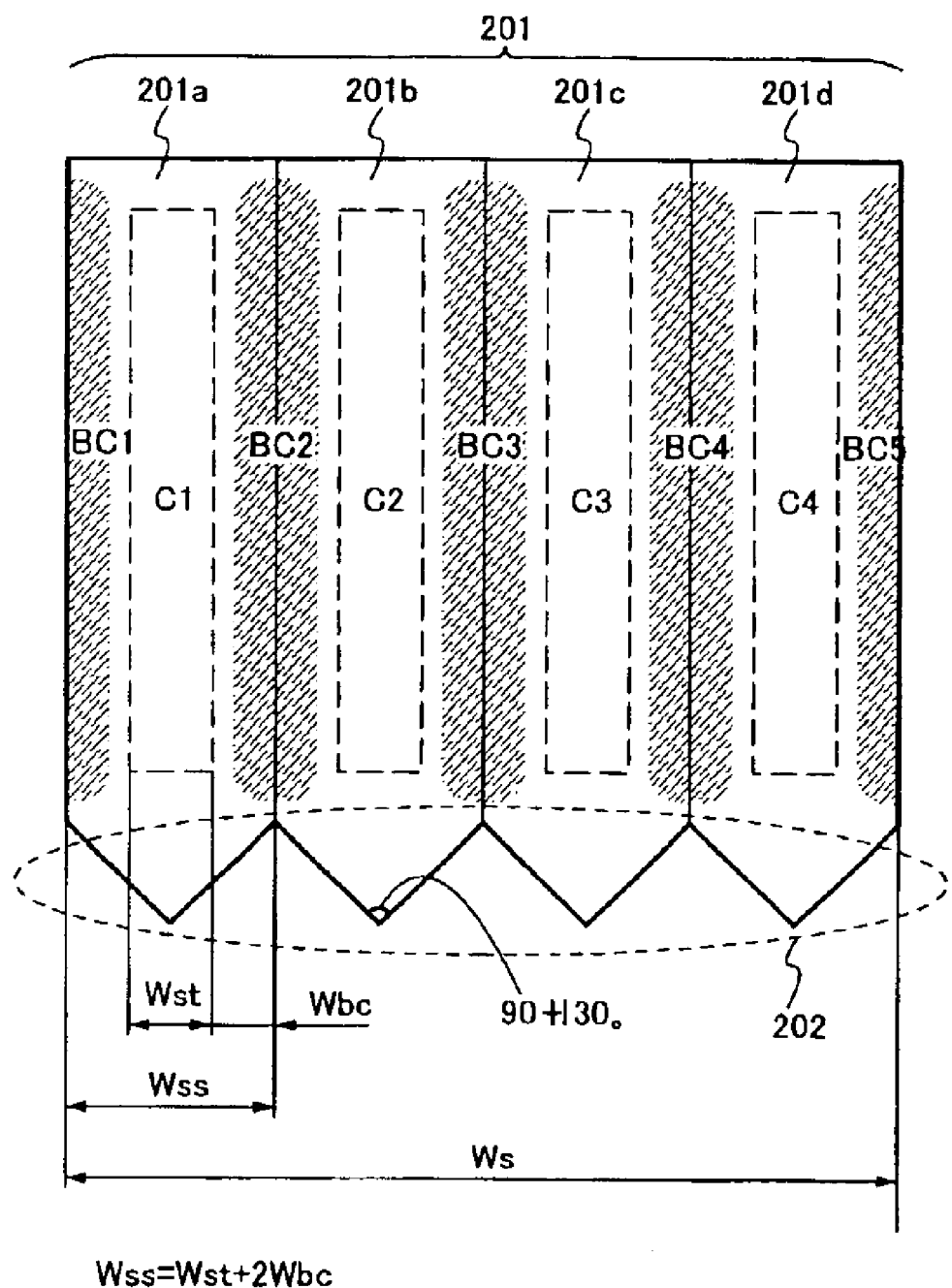
FIG. 4 illustrates details of a crystallization process according to the invention.

FIG. 4 is a top view illustrating so crystallized first shape of semiconductor region 201. As described above, a crystal grows from the both of the convex end (seed region) 202 and the concave portion therebetween, while a good crystallization region is C1 to C4 enclosed by a roughly dotted line, which are grown from the convex end (seed region) 202. A region of a grain boundary or distortion-accumulated crystal, which is grown from the concave portion, is regions BC1 to BC5 shown by an oblique line.

The first shape of semiconductor region 201 can be considered to be integrally formed by a plurality of semiconductor regions 201a to 201d having a sharp convex top-end and disposed in parallel. Assuming that a width of the first shape of semiconductor region 201 is Ws, a width of the semiconductor regions 201a to 201d having a sharp convex top-end is Wss, good crystallization regions (C1 to C4) are Wst and a range of a grain boundary or a distortion-accumulated crystal, which is grown from the concave portion, is Wbc, ½ to ⅕, preferably ⅓ of Wss is intentionally eliminated by Wbc to form Wst. Wst is preferably 0.5 to 1.0 μm in view of crystal growth extended in a single direction.

Figure 5:
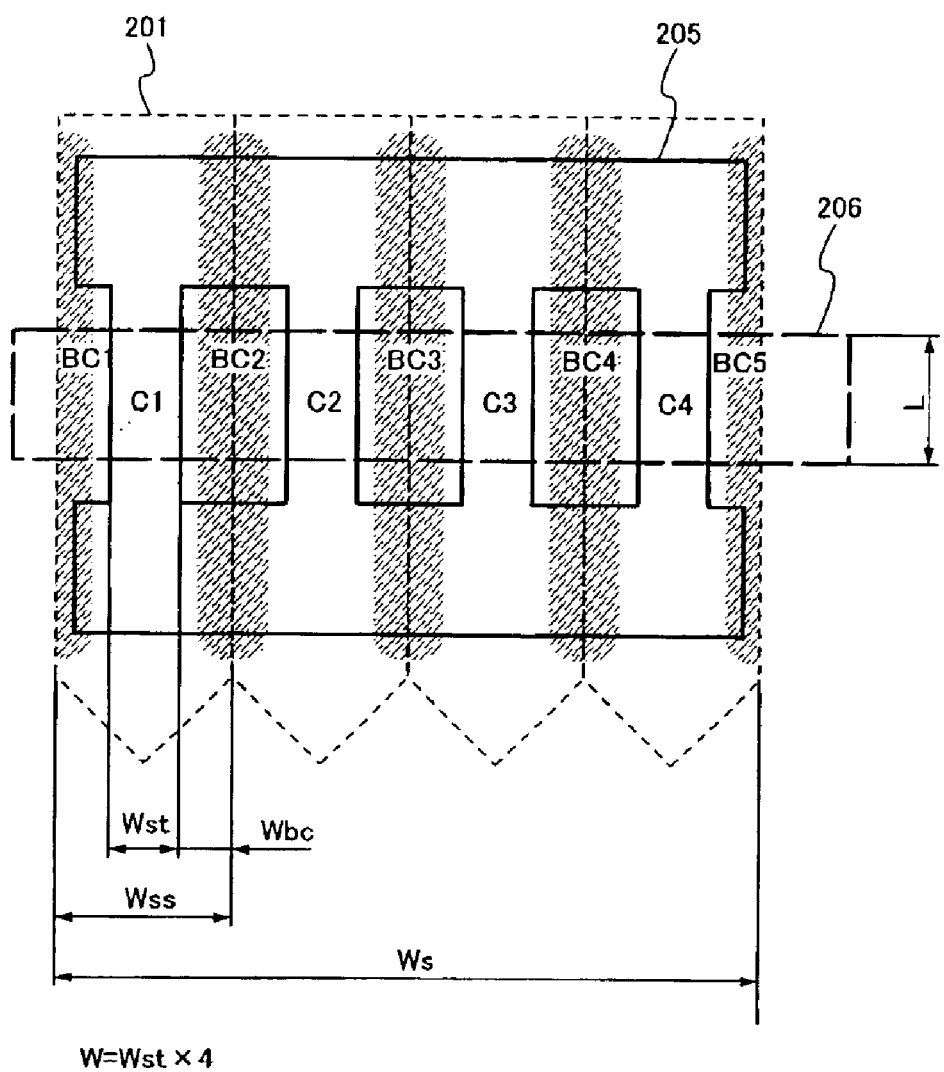
FIG. 5 illustrates details of a crystallization process according to the invention.

As shown in FIG. 5, a second shape of semiconductor region 205 formed by etching the first shape of semiconductor region 201 can be considered to be formed into one body by a plurality of rectangular semiconductor regions consisting of the good crystals C1 to C4 and a pair of semiconductor regions continuously connected to the rectangular semiconductor regions. Providing a gate electrode 206 through an insulating film (not shown) in the second shape of semiconductor region 205, as shown by a dashed line in the drawing, can allow the good crystals C1 to C4 to be a channel forming region.

Figure 6:
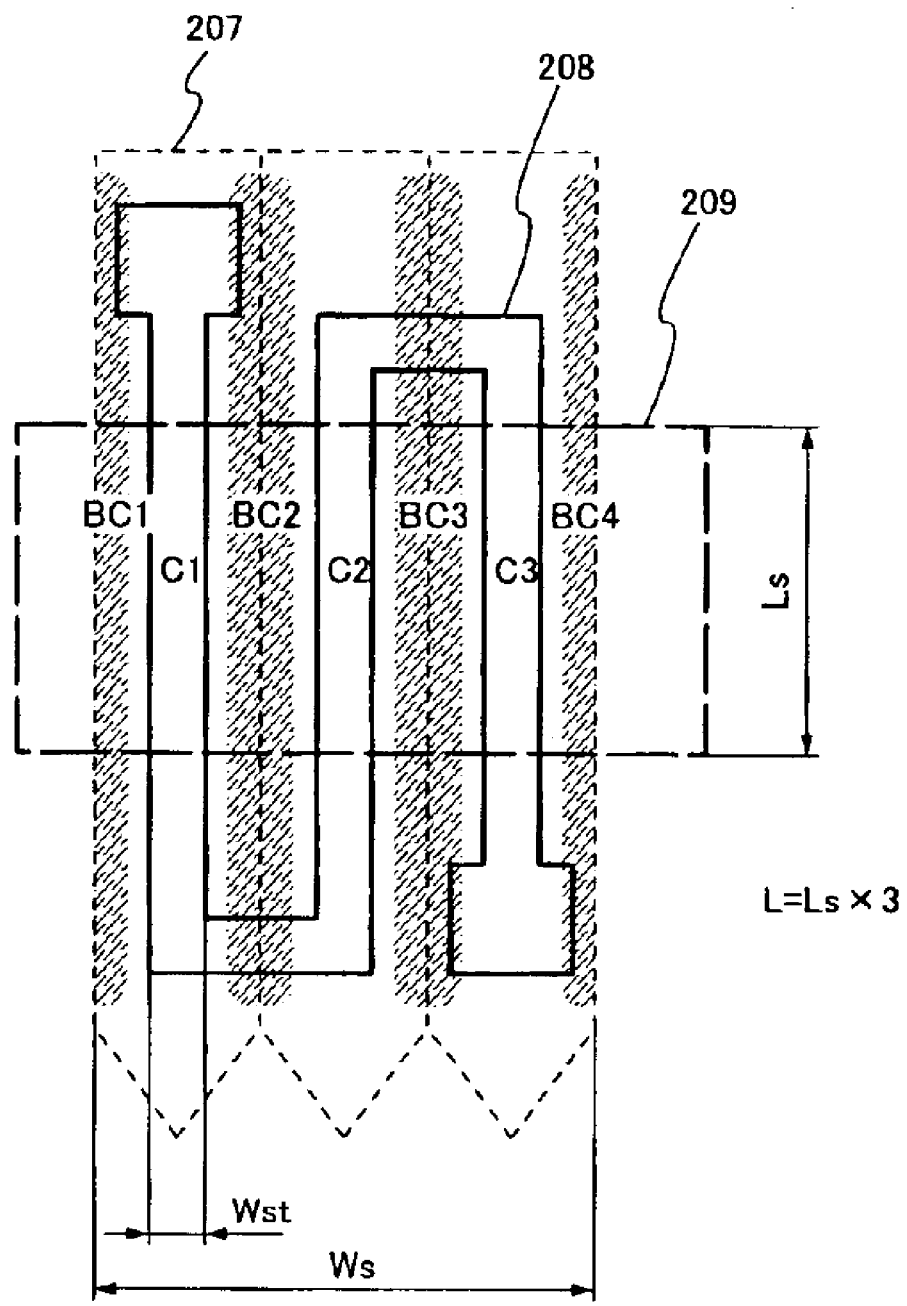
FIG. 6 illustrates details of a crystallization process according to the invention.

FIG. 6 shows an example of another structure. In FIG. 6, a second shape of semiconductor region 208 formed from a first shape of semiconductor region 207 has a configuration in which a plurality of rectangular semiconductor regions disposed in parallel are continuously connected in series and a pair of semiconductor regions continuously connected to the both ends of the rectangular semiconductor regions are formed into one body. In this case, providing a gate electrode 209 through an insulating film (not shown) in the second shape of semiconductor region 208, as shown by a dashed line in the drawing, can also allow the good crystals C1 to C4 to be a channel forming region and it can be arranged that a crystal extends along the channel length direction.

Figure 23A:
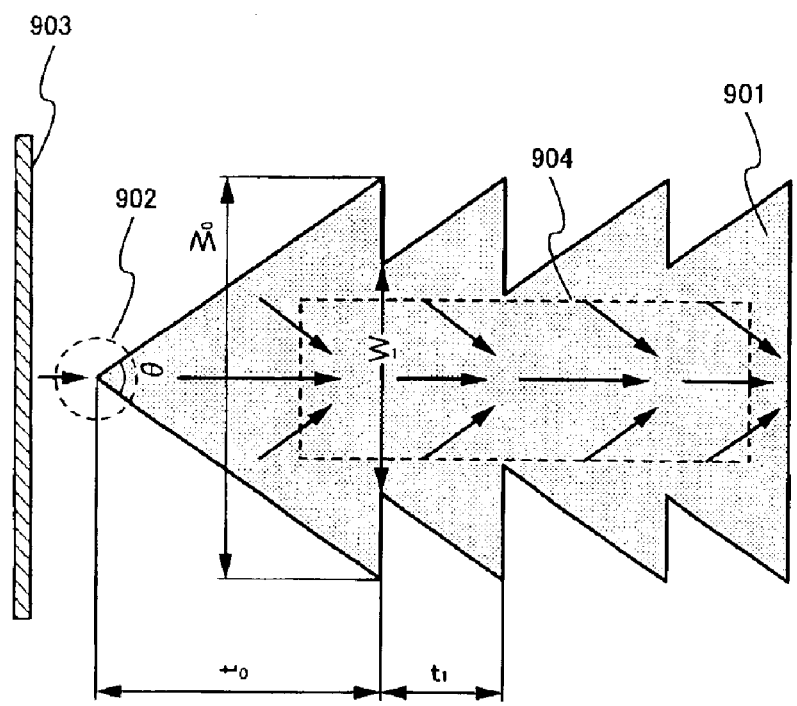
FIGS. 23A and 23B illustrate a crystallizing method according to the invention and a relation between a first shape of semiconductor region and crystal growth.

FIG. 23 shows another example of a preferable configuration of a first shape of semiconductor region. In a basic form shown in FIG. 23A, a first shape of semiconductor region 901 is provided with a seed region 902 from which the first shape of semiconductor region starts to widen toward a width $W_0$. The first shape of semiconductor region is constricted to a width $W_1$ at a distance $t_0$, and after that, it widens and is constricted every distance $t_1$ (not necessarily periodically).

Crystallization with a continuous wave laser beam 903 starts from the seed region 902, while uncontrolled crystallization also occurs from a sidewall portion of the first shape of semiconductor region 901. The outline shown in FIG. 23A has a structure for restraining crystal growth from the uncontrolled sidewall, which can be obtained by providing constricted portions. A second shape of semiconductor region is formed in a region 904 enclosed by a dotted line in the drawing.

Figure 23B:
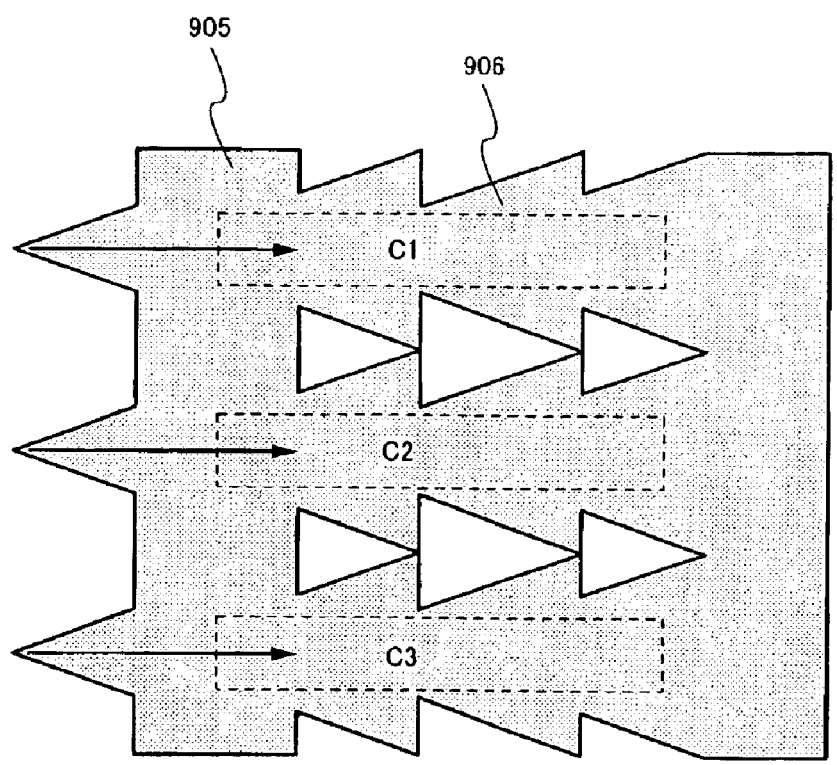

FIG. 23B shows a structure in which the first shape of semiconductor region 901 shown in FIG. 23A is continuously connected in parallel. This structure is considered to be a first shape of semiconductor region 905. A second shape of semiconductor region is formed in a region 906 enclosed by a dotted line in the drawing. Using the first shape of semiconductor region 905 enables crystallization by radiation with a continuous wave laser beam as well as the above.

Figure 7:
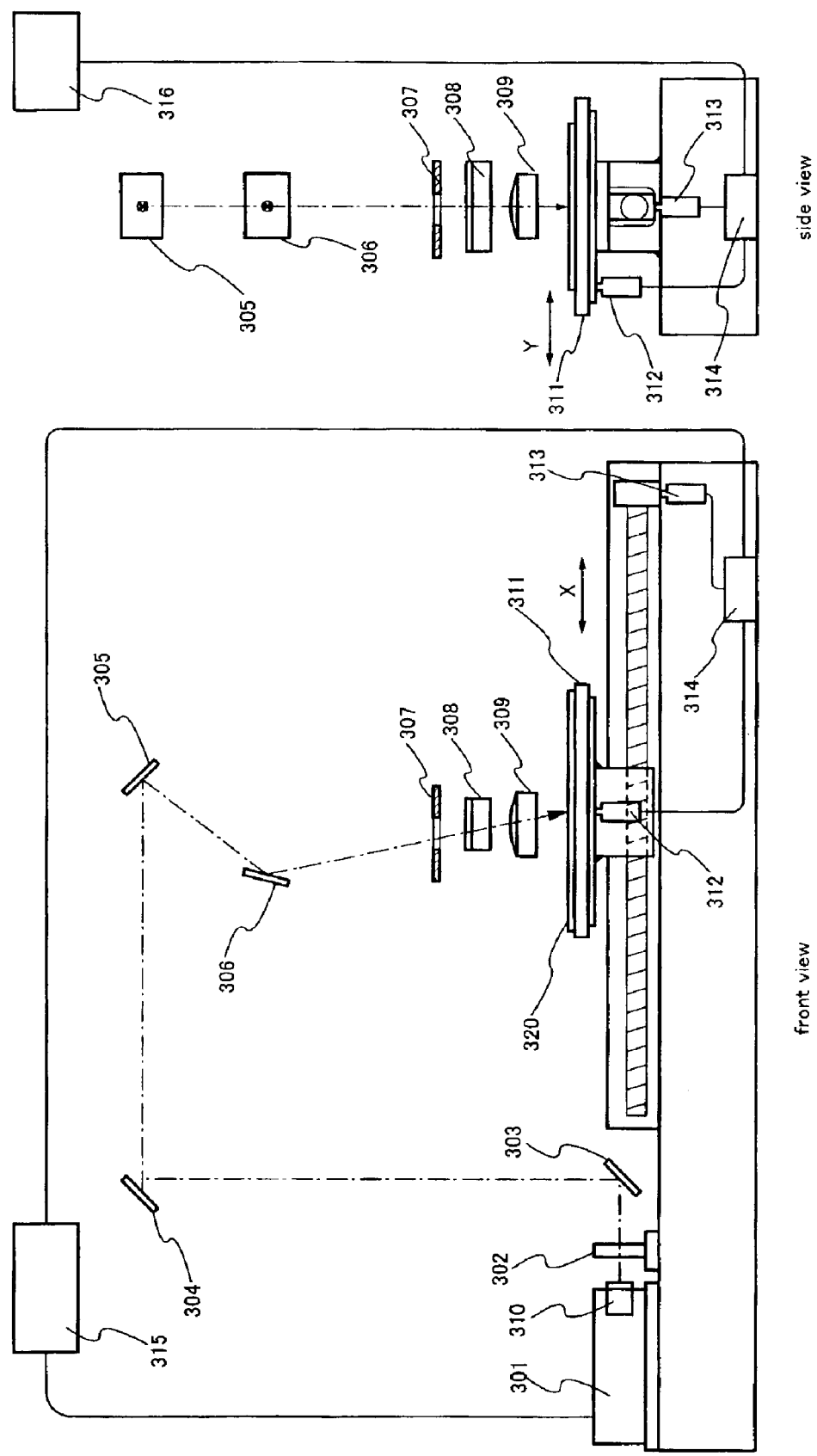
FIG. 7 illustrates an embodiment of a laser radiation device employed in the invention.

FIG. 7 shows an example of a structure of a laser processing device applicable to the invention. FIG. 7, shows in front and side views a structure of a laser processing device comprising a laser oscillator device 301, a shutter 302, high transforming mirrors 303 to 306, a slit 307, a cylindrical lenses 308 and 309, a table 311, driving means 312 and 313 for displacing the table 311 in X and Y directions, a control means 314 for controlling the driving means and an information processing means 315 for sending a signal to the laser oscillator device 301 and the controlling means 314 on the basis of a program stored in advance.

A laser beam linearly condensed by cylindrical lenses 308 and 309 in a cross section of a radiation surface is obliquely incident on a surface of a substrate 320 put on the table 311. A point of focus is then shifted due to aberration such as astigmatism and a linear condensing surface can be formed on or in the vicinity of the radiation surface. The cylindrical lenses 308 and 309 made of composite quartz offer high transmittance. A coating on a surface of the lenses is employed so as to achieve transmittance of 99% or more for a wavelength of the laser beam. The shape of a cross section of the radiation surface is, of course, not limited to linear, but may be in any shape such as rectangle, ellipse and super ellipse. A ratio of a short axis to a long axis of the shape is within a range between 1 to 10 and 1 to 100, in any event. A wavelength transforming element 310 is provided so that a high harmonic can be obtained for a fundamental wave.

As a laser oscillator device, is employed a rectangular beam solid laser oscillator device, especially preferably, a slab laser oscillator device, as described above. Alternatively, it is possible to employ a solid laser oscillator device using a crystal, which consists of a crystal such as YAG, YVO$_4$, YLF and YalO$_3$ doped with Nd, Tm or Ho, in combination with a slab structure amplifier. As slab materials, may be used a crystal such as Nd:YAG, Nd:GGG (gadolinium gallium garnet) and Nd:GSGG (gadolinium scandium gallium garnet). Besides the above, it is also possible to employ a gas laser oscillator device or a solid laser oscillator device capable of continuous light emission. As a continuous wave solid laser oscillator device, is employed a laser oscillator device using a crystal, which consists of a crystal such as YAG, YVO$_4$, YLF and YAlO$_3$ doped with Cr, Nd, Er, Ho, Ce, Co, Ti or Tm. A fundamental wave of an oscillation wavelength oscillates at a wavelength of 1 μm to 2 μm, although it depends on materials to be doped. It is possible to employ a diode-exciting type of solid laser oscillator device to be cascade-connected in order to obtain higher output.

Further, moving the table 311 by means of the driving means 312 and 313 in two axial directions enables laser process of the substrate 320. Moving in one direction can be continuously performed at an equal speed of 1 to 200 cm/sec, preferably 5 to 50 cm/sec for a distance longer than a side length of the substrate 320, while in the other direction step-moving can be discontinuously performed for a distance almost equal to a longitudinal length of a elliptic beam. It is arranged that oscillation of a laser oscillator device 101 and the table 311 be synchronously operated by means of the information processing means 315 provided with microprocessors.

When a laser beam for radiation of the substrate 320 by a laser radiation device having such structure is moved relatively in the X or Y direction shown in the drawing, a desired region or all surface of a semiconductor film can be processed. As described above with reference to FIGS. 1A to 1C, it becomes possible to make a crystal orientation single and to improve mobility of field effect, when a scanning direction of a laser beam is roughly corresponded to a channel length direction in a TFT. Then, in the case of a top gate type of TFT, quality of a gate insulating film formed on a TFT would not disperse, so that dispersion of threshold voltage can be also reduced. The invention, of course, can be applied to a bottom gate type (or an inverted staggered type) of TFT.

DESCRIPTION OF THE EMBODIMENTS

Concrete examples of a method of manufacturing a semiconductor device according to the invention will be now described in details with reference to the drawings, using embodiments.

Embodiment 1

In this embodiment, an amorphous silicon film formed on an insulating surface is etched into a predetermined pattern in a photoetching method to form a first shape of semiconductor region, which is then crystallized by means of a continuous wave laser beam.

Figure 8A:
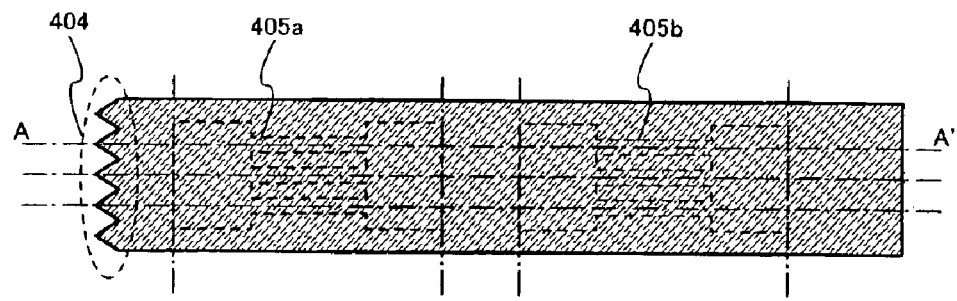
FIGS. 8A and 8B show a top view and a cross-sectional view illustrating a crystallizing method according to the invention.
Figure 8B:
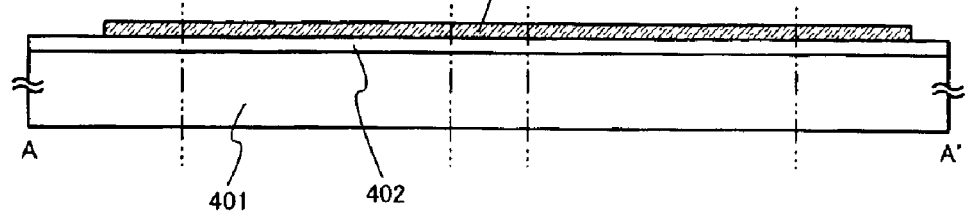

In FIGS. 8A and 8B, a barrier layer 402 consisting of a silicon oxide nitride film of 100 nm is formed on a glass substrate 401. A first shape of semiconductor region 403 on the barrier layer 402 is an amorphous silicon film formed by a plasma-CVD method into a thickness of 100 nm. FIG. 8A is a top view of the first shape of semiconductor region 403, while FIG. 8B shows a cross-sectional structure including a substrate. Second shape of semiconductor regions 405a and 405b for providing an active layer of a TFT are formed inside the first shape of semiconductor region 403 so as not to reach the end thereof, as shown by dotted lines, although they are not yet concretely expressed in this stage.

A region provided with a plurality of sharp convex top-end portions (seed region) 404 is formed at one end of the first shape of semiconductor region 403. Radiation with a laser beam from the region 404 allows a crystal to continuously grow with a crystal core appearing at the region 404 being a starting point.

Figure 9A:
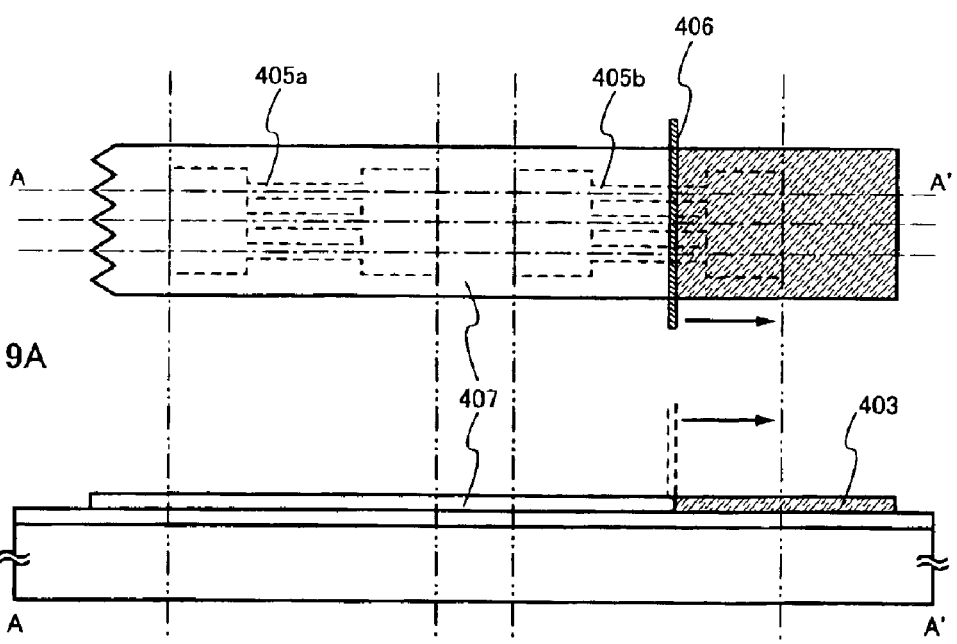
FIGS. 9A and 9B show a top view and a cross-sectional view illustrating a crystallizing method according to the invention.
Figure 9B:
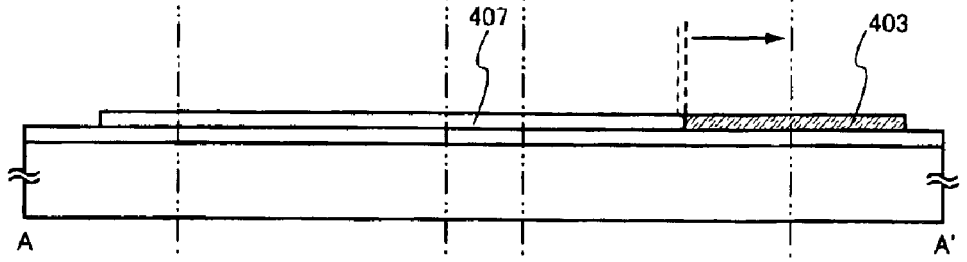

FIGS. 9A and 9B show a crystallization stage by means of a continuous wave laser beam. A laser beam 406 is used for radiation so that its longitudinal direction would cross the lateral direction of the first shape of semiconductor region 403, in order to allow a crystal to grow from one end to the other end of the first shape of semiconductor region 403. A laser processing device having a structure shown in FIG. 7 can be applied to such laser beam radiation. A laser beam condensed by means of an optical system may have strength dispersion having an even region in a longitudinal direction and dispersion in a lateral direction. Crystallization is mainly carried out in the region in which the strength dispersion is even in a longitudinal direction. This can enhance an effect of crystal growth in a direction parallel to a scanning direction of the laser beam.

Crystallization thus progresses from the region radiated with the laser beam 406 and continuous moving of a solid-liquid interface can provide a crystalline semiconductor 407.

The first shape of crystallized semiconductor region 403 is then photoetched to form the second shape of semiconductor regions 405*a* and 405*b*, as shown in FIGS. 10A and 10B. The second shape is formed by remaining a crystal on an extended line of the convex portion of the seed region 404 while eliminating a crystal on an extended line of the concave portion in an assumed channel forming region. In the second shape, a plurality of channel forming regions are provided in a single transistor or between a pair of a source and a drain. The second shape of semiconductor regions 405*a* and 405*b* can be provided with a gate insulating film, a gate electrode and a single conductor type of impurity region to form a TFT in order to obtain a top gate type of TFT. It is possible to form a wiring and an interlayer insulating film after the above, if necessary.

In such a crystallization method, radiation with a continuous wave laser beam enables growth of a crystal in which grains extend in a single direction. This can be practically achieved by setting a scanning speed at 5 to 100 cm/sec, although it is, of course, required to set at any time detailed parameters such as a scanning speed and energy density of a laser beam. A speed of crystal growth experienced a melt-solidification process by means of a pulse laser is said to be 1 m/sec. Scanning with a laser beam at the slower speed and gradually cooling the surface, however, allows a crystal to continuously grow in a solid-liquid interface, so that a grain size of a crystal can be practically enlarged.

Embodiment 2

The scanning of the laser beam in the embodiment 1 may be scanned not only in one direction but also back-and-forth strokes. In this case, the seed regions 404*a* and 404*b* may be provided at both sides of the first semiconductor region 403 as shown in the embodiment of FIGS. 11A and 11B. In case of back-and-forth strokes, laser energy density is changed every stroke so that the crystal growth can be phased. The scanning of the laser beam also serves for hydrogen extraction treatment that is often required in case of crystallization of amorphous silicon film. After hydrogen is extracted by scanning at low energy density at first, the crystallization may be performed by the second scanning at higher energy density. This producing method also results in a crystal semiconductor film which crystal grains extend in the scanning direction of the laser beam.

Embodiment 3

The embodiment 3 intends that an amorphous silicon film formed on an insulating surface is crystallized in advance and enlargement of a crystal grain by a continuous wave laser beam.

Figure 12A:
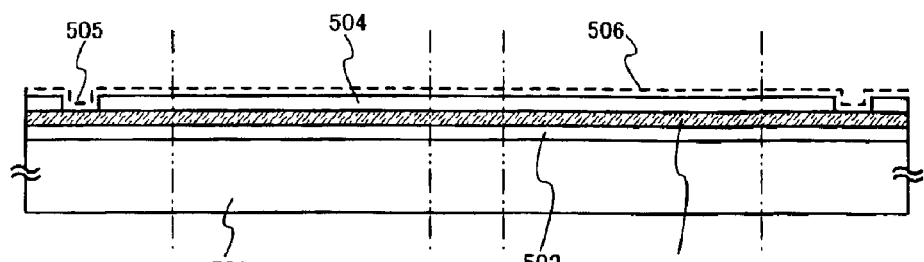
FIGS. 12A to 12C show cross-sectional views illustrating a crystallizing method according to the invention.

As shown in FIG. 12A, blocking layer 502 and a amorphous silicon film 503 are formed on a glass substrate 501 like the embodiment 1. A 100 nm thick oxide silicon film as a masking insulation film 504 is formed on the blocking layer 502 and the amorphous silicon film 503 by plasma CVD technique, and an opening 505 is provided. In order to add Ni as a catalytic element, water solution containing 5 ppm nickel acetate is spin-coated. Ni is in contact with the amorphous silicon film at the opening 505. A location where the opening 505 is formed is located in the seed region of the first semiconductor region that is formed later or out side of the seed region.

Figure 12B:
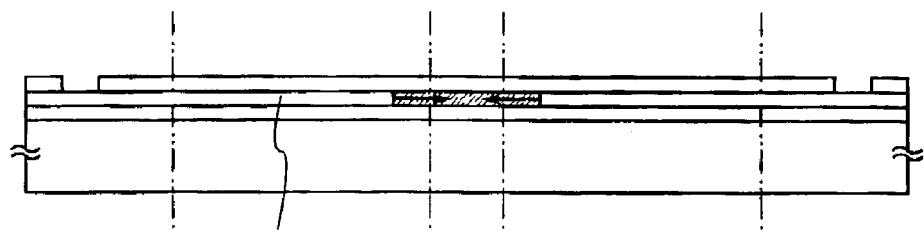

Then, as shown in FIG. 12B, the amorphous silicon film is crystallized by a 4 hours heat treatment at a temperature of 580° C. The crystallization grows by effect of the catalytic element from the opening 505 to the direction parallel to a substrate surface. A crystal silicon film 507 formed in such a way is constituted by aggregate of bar or needle crystals. Each crystal is grown macroscopically with a specific directional property so that crystalline orientation is uniform. The crystal silicon film 507 is characterized by having a higher orientation ratio of a specific direction.

Figure 12C:
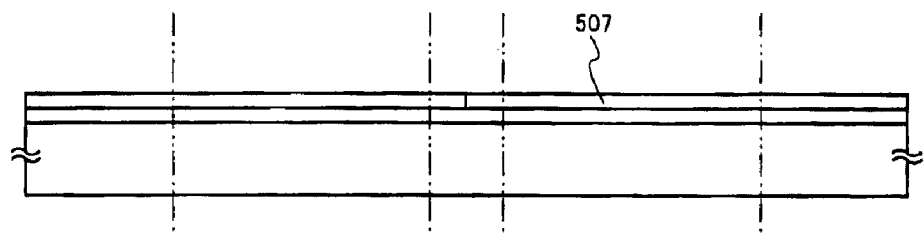

Finishing heat treatment, the masking insulation film 504 is removed by etching so that the crystal silicon film 507 can be obtained as shown in FIG. 12C.

Figure 13A:
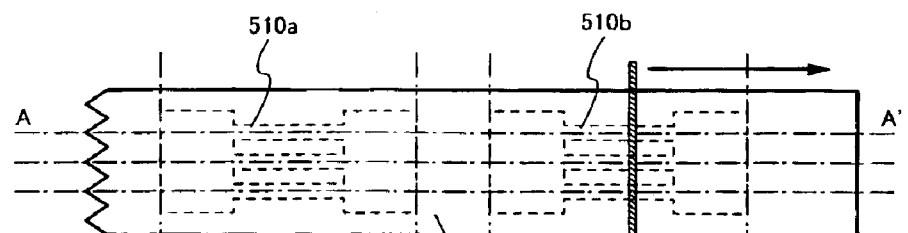
FIGS. 13A and 13B show a top view and a cross-sectional view illustrating a crystallizing method according to the invention.
Figure 13B:

The crystal silicon film 507 is etched into a fixed pattern by photoetching as shown in FIGS. 13A and 13B to form a first semiconductor region 508. A region where second semiconductor regions 510*a* and 510*b* should be formed as an active layer of TFT is located inside of the first semiconductor region 508. As shown in FIGS. 13A and 13B, a continuous wave laser beam 509 is scanned in one direction or back-and-forth strokes.

The crystal silicon film is melted by such an irradiation of the laser beam to be recrystallized. With this recrystallization, crystal growth that crystal grains extend in the scanning direction of the laser beam occurs. In this case, the crystal silicon film having uniform crystal faces is formed in advance so that precipitation of a crystal having a different crystal face and creation of dislocation can be prevented. In embodiments described below, the TFT can be formed by the same treatments as the embodiment 1.

Embodiment 4

Figure 14A:
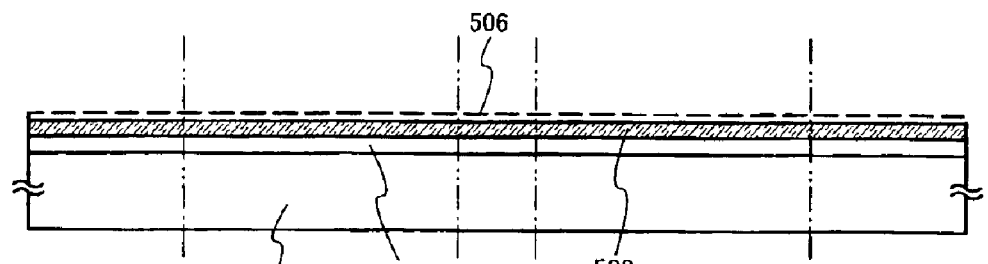
FIGS. 14A and 14B show a cross-sectional views illustrating a crystallizing method according to the invention.

In the same way as the embodiment 3, the glass substrate 501, the blocking layer 502 and the amorphous silicon film 503 are formed, and then Ni as the catalytic element is added over the surface. The method for adding Ni is not limited so that different method such as spin coating, vapor deposition and sputtering can be adopted. In case of the spin coating method, water solution containing 5 ppm nickel acetate is applied to form a layer including catalytic element 506 (FIG. 14A).

Figure 14B:
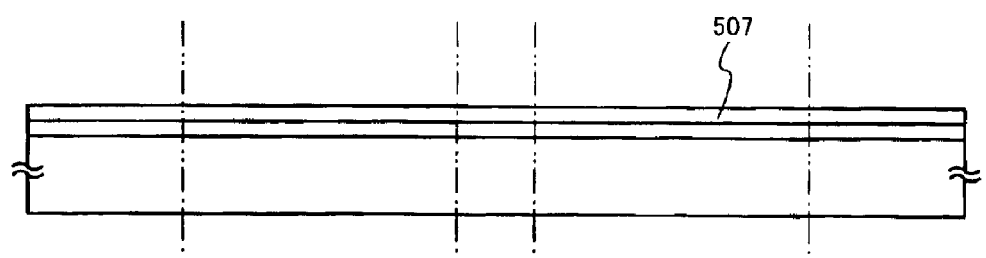

Then the amorphous silicon film 503 is crystallized by the 4 hours heat treatment at a temperature of 580° C. Consequently, the crystal silicon film 507 is obtained as shown in FIG. 14B. The crystal silicon film 507 formed is also constituted by aggregate of bar or needle crystals. Each crystal is grown macroscopically with a specific directional property so that crystalline orientation is uniform. The crystal silicon film 507 is characterized by having a higher orientation ratio of a specific direction. Processes after the heat treatment can be treated in the same way as the embodiment 3.

Embodiment 5

Figures 16A, 16B:
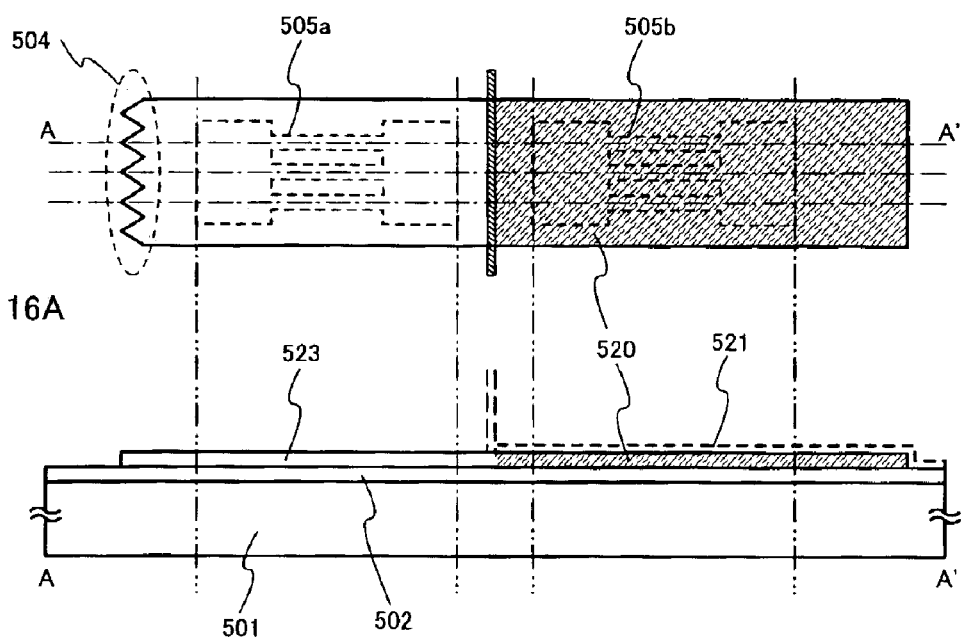
FIGS. 16A and 16B show a top view and a cross-sectional view illustrating a crystallizing method according to the invention.

As shown in FIGS. 16A and 16B, a first shape of semiconductor region 520 is formed after forming a glass substrate 501, a blocking layer 502 and an amorphous silicon film as well as Embodiment 3. Then, Ni is added on the whole surface as a catalyst element. A method of adding Ni is not limited specifically, and spin-application, vapor deposition and sputtering would be applicable. In the case of the spin-application method, an aqueous solution including nickel acetate of 5 ppm is applied to form a catalyst element including layer 521.

After the above, a continuous wave laser beam is used for radiation to form a crystalline silicon film 523. It is characterized that crystallization is improved in orientation due to an operation of a catalyst element and that an applicable range is widened under a radiating condition of a continuous wave laser beam to be used for radiation. The latter is also due to an operation of a catalyst element and caused by lowering of core forming temperature or crystallization starting temperature. As for the subsequent processes, it is possible to process as well as Embodiment 3.

Embodiment 6

As shown in FIG. 17A, a first shape of semiconductor region 520 is formed after forming a glass substrate 501, a blocking layer 502 and an amorphous silicon film as well as Embodiment 3. Then, Ni is added on the whole surface as a catalyst element. A method of adding Ni is not limited specifically, and spin-application, vapor deposition and sputtering would be applicable. In the case of the spin-application method, an aqueous solution including nickel acetate of 5 ppm is applied to form a catalyst element including layer 521.

After the above, furnace annealing is carried out for a heating process at 450 to 600 degrees centigrade for 1 to 30 minutes. Alternatively, rapid thermal annealing (RTA) is carried out for a heating process at 500 to 750 degrees centigrade for 10 to 120 seconds, and then, a core of a crystal is formed in the first shape of semiconductor region 520 consisting of an amorphous semiconductor film. A first shape of crystalline semiconductor film 524 provided in its inside with a crystal core originated from a catalyst element is accordingly formed, as shown in FIG. 17B.

Crystallization is then performed by radiation with a continuous wave laser beam as shown in FIGS. 18A and 18B. It is characterized that crystallization is improved in orientation due to an operation of a crystal core formed in advance and that an applicable range is widened under a radiation condition of a continuous wave laser beam to be used for radiation. The latter is due to an operation of a catalyst element and caused by lowering of core forming temperature or crystallization starting temperature. A first shape of semiconductor region 525 crystallized by means of the continuous laser beam is formed accordingly. Crystallization is, of course, carried out with a seed region 519 formed in the first shape of semiconductor region 524. Crystal growth starting form the seed region 519 allows an orientation to be improved. As for the subsequent processes, it is possible to process similarly to Embodiment 3.

Embodiment 7

A process of eliminating by gettering a catalyst element remaining in a crystalline silicon film 507 with concentration of $10^{19}/cm^3$ or more may be added after forming the crystalline silicon film 507 in Embodiment 3 or 4.

Figure 15:
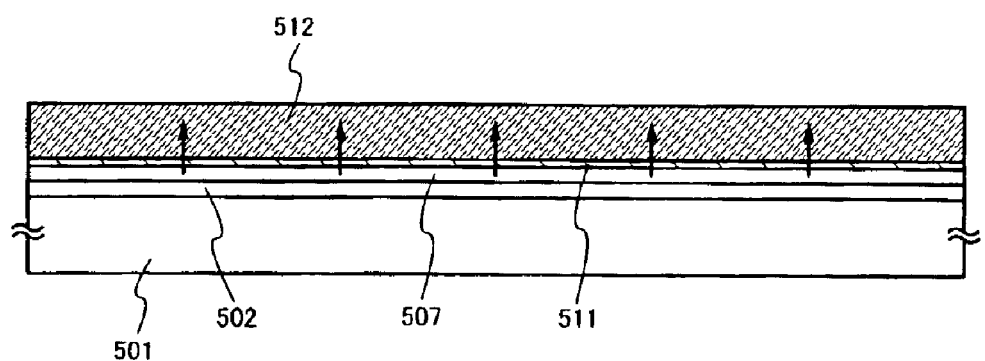
FIG. 15 shows a cross-sectional view illustrating a crystallizing method according to the invention.

As shown in FIG. 15, a barrier layer 511 consisting of a thin silicon oxide film is formed on the crystalline silicon film 507, and then, an amorphous silicon film to which argon of $1\times10^{20}/cm^3$ to $1\times10^{21}/cm^3$ as gettering site 512 is added is formed on the barrier layer 511.

After the above, furnace annealing is carried out for a heating process at 600 degrees centigrade for 12 hours, or a heating process is carried out at 650 to 750 degrees centigrade for 30 to 60 minutes by lamp annealing or gas thermal annealing so as to segregate Ni added as a catalyst element on a gettering site 512. This process allows the concentration of a catalyst element of the crystalline silicon film 507 to be less than $10^{17}/cm^3$.

The process can be advanced as well as Embodiment 3 or 4 after completing the gettering process. In gettering, the same process may be carried out after forming the first shape of semiconductor region. Further, it is also effective to perform the same process after forming the second shape of semiconductor region. Moreover, the same process may be carried out after the crystallization process by means of radiation with a continuous wave laser beam. In any case, gettering with enhanced crystallinity makes it easy to segregate a catalyst element such as Ni on a gettering site.

Embodiment 8

Figure 19A:
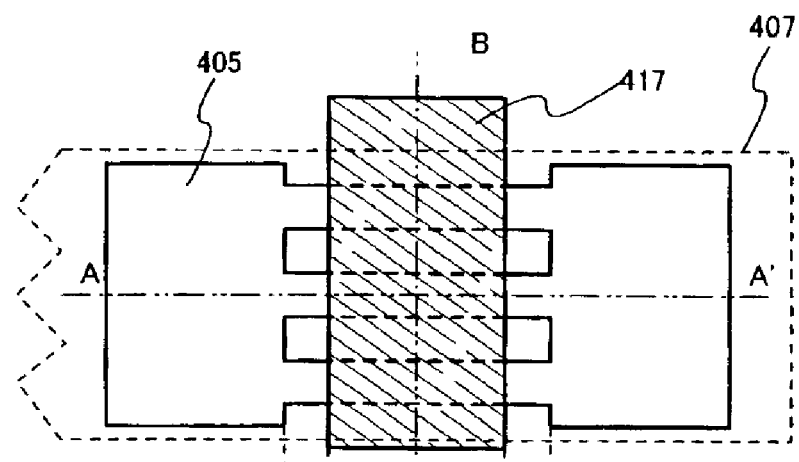
FIGS. 19A to 19C show a top view and cross-sectional views illustrating a structure of a TFT using a crystalline semiconductor film formed in a crystallizing method according to the invention.
Figure 19B:
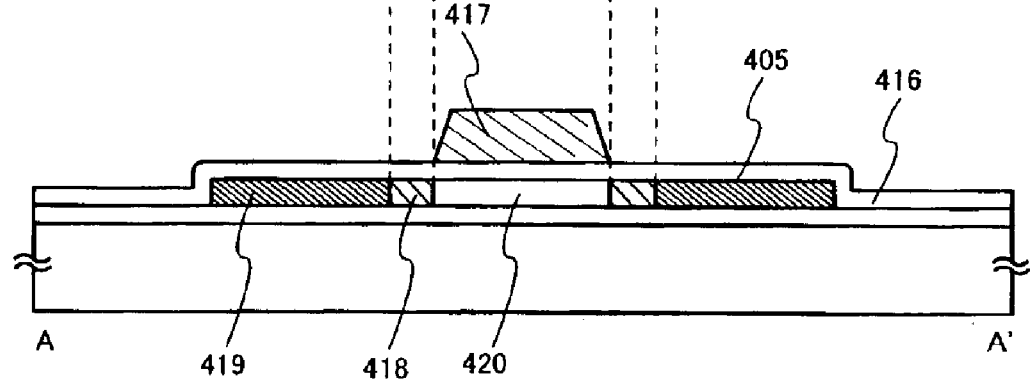
Figure 19C:
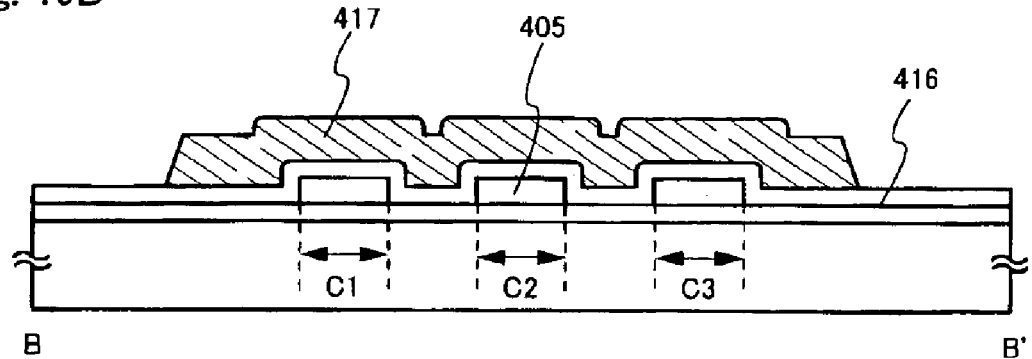

FIGS. 19A to 19C show a form in forming a TFT by means of a second shape of semiconductor region 405 produced on the basis of Embodiments 1 to 7 and illustrates a positional relation with a gate electrode. FIG. 19A shows a form of the second shape of semiconductor region 405, which is integrally formed by a plurality of rectangular semiconductor regions disposed in parallel and a pair of semiconductor regions continuously connected to the rectangular semiconductor regions. In FIG. 19A, a gate electrode 417 is provided so as to cross the plurality of rectangular semiconductor regions. FIG. 19B shows a vertical cross-section along a line A–A' in FIG. 19A. FIG. 19C shows a vertical cross-section along a line B–B' in FIG. 19A.

A TFT shown in FIGS. 19A to 19C is characterized in that the gate electrode 417 is provided not only on the top surface but also on the side surface of the plurality of rectangular semiconductor regions, and thereby, a field effect is produced over a large area and a channel width substantially increases. That is to say as for a channel width, not only a width of semiconductor regions C1 to C3 as shown in FIG. 19C but a component in thickness direction should be also considered.

Figure 24:
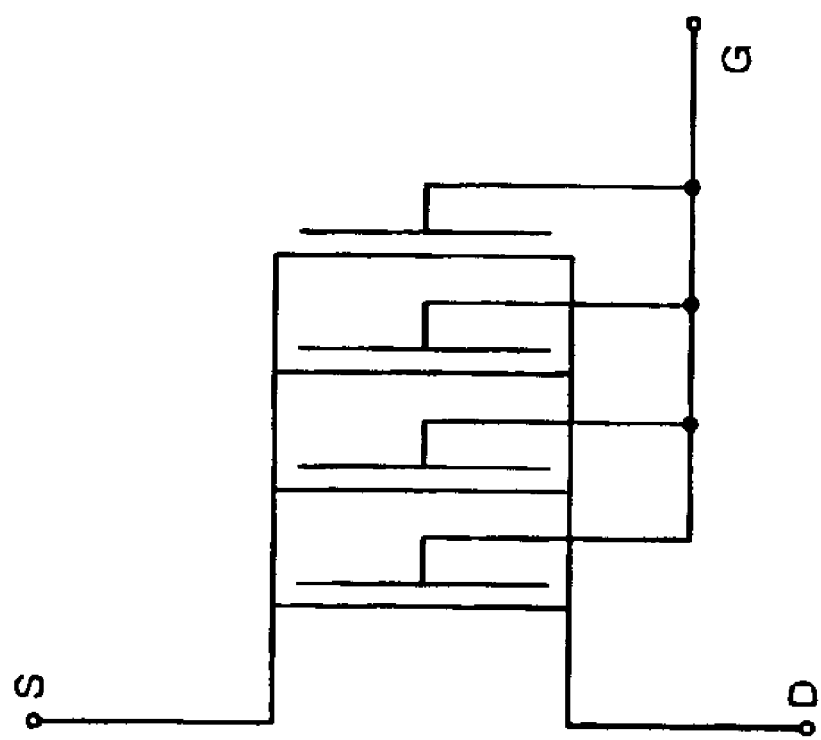
FIG. 24 is an equivalent circuit diagram of a TFT produced in accordance with the invention.

As shown in FIG. 19B, a channel forming region 420, a low density drain region 418 and source and drain regions 419 are formed in the second shape of semiconductor region 405. FIG. 24 shows an equivalent circuit thereof in which a plurality of channels is provided in parallel between source and drain regions to form a transistor. Accordingly, providing cannel forming regions in parallel allows resistance in the source and drain regions and/or in the low density drain region to give feedback, so that a current flowing through respective channels can be equalized. Such a structure of a transistor can decrease dispersion of a characteristic among a plurality of elements.

Embodiment 9

In the embodiment 9, an example producing a CMOS type of TFT by using the second semiconductor region on an insulating film that is formed in the embodiments 1 to 8 will be described referring to FIGS. 20A to 20C.

Figure 20A:
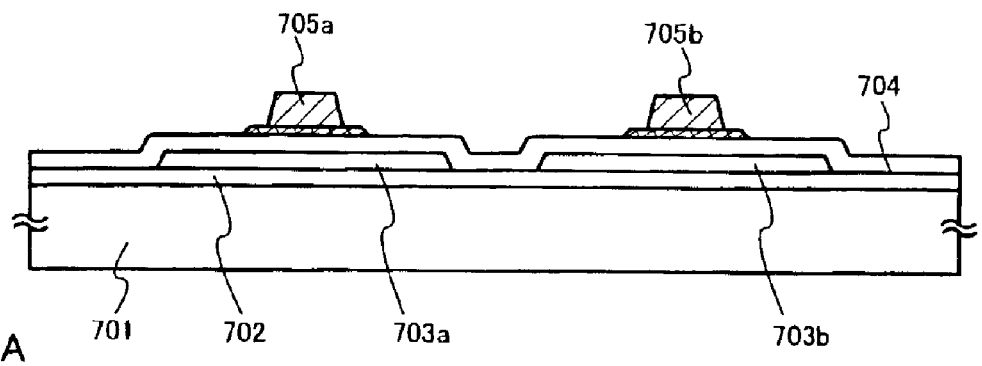
FIGS. 20A to 20C show cross-sectional views illustrating a process of producing a TFE using a crystalline semiconductor film formed in a crystallizing method according to the invention.

FIG. 20A shows a state which second semiconductor regions 703a and 703b as the active layer, a gate insulating film 704 and gate electrodes 705a and 705b are formed on a glass substrate 701 and a blocking layer 702. The gate insulating film 704 of 80 nm in thickness is formed in a manner that a silicon nitride oxide film is made from $SiH_4$, $N_2O$ and $O_2$ as reaction gas by plasma CVD method. Because an orientation ratio of crystals in the second semiconductor regions 703a and 703b is high, dispersion of film quality of the gate insulating film formed on the second semiconductor regions can be reduced. This causes dispersion of threshold voltage of TFT to be reduced. Electrically conductive materials such as Al, Ta, Ti, W and Mo or alloys of these metallic elements are suitable for a material of which the gate electrodes 705a and 705b are made. The gate electrodes are formed 400 nm in thickness. Al may be used as the gate electrodes and an oxide film is formed on its surface by anodic oxidation to be stabilized.

Figure 20B:
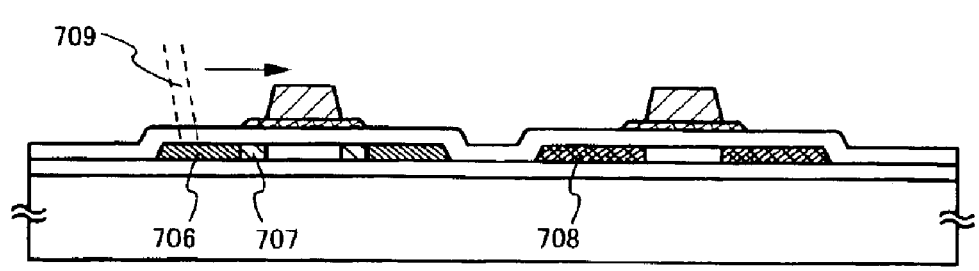

FIG. 20B shows a formation of an impurity region which a source or drain region 706 for an n-channel type of TFT, an LDD region 707, and a source or drain region 708 for p-channel type of TFT are formed by ion doping method.

Crystalline structure is destroyed to become amorphous structure in a region where impurity elements are injected by the ion doping. In order to recover the crystalline structure and realize lower electrical resistance by activating the impurity elements, laser treatment is performed. The laser treatment can be done by the laser treatment machine as shown in FIG. 7. By the laser treatment machine as shown in FIG. 7, the laser light 709 is irradiated to source and drain regions 706 and 708 and the LDD region 707, the activation of added impurities can be conducted. Hydrogenation may be carried out at the same time in a manner that laser irradiation is done in a hydrogen atmosphere (reducing atmosphere).

Figure 20C:
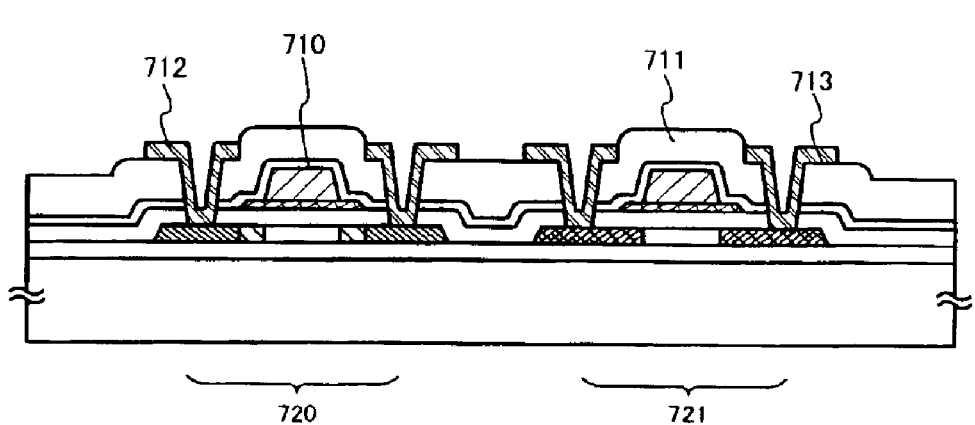

An interlayer insulating film 710 is formed by a silicon nitride film or a silicon oxide film as shown in FIG. 20C. Furthermore, an interlayer insulating film 711 is formed by organic resin material or low dielectric constant material having a dielectric constant not more than 4. Acrylic and polyimide are useful for the organic resin material. SiOF, poly-arylethers, BCB (benzocyclobutene), fluoride polyimide, a-CF are useful for the low dielectric constant material. A contact hole reaching to an impurity region of each semiconductor layer is formed, and then wirings 712 and 713 are formed by using Al, Ti and Ta.

As described above, an n-channel type of TFT and a p-channel type of TFT are obtained. Though each TFT is shown as a single element in FIG. 20C, not only a CMOS circuit but also a single channel type of NMOS circuit and a PMOS circuit can be constructed by these TFTS. In the active layer according to the invention, crystal growth is made parallel to a direction of channel length so that a grain boundary that a carrier crosses is substantially eliminated. This permits high electric field effect mobility to be obtained. The TFT thus produced can be used for producing an active matrix type of liquid crystal display apparatus and a display apparatus having a light-emitting device and also used as a TFT that a memory or a microprocessor is formed on a glass plate.

Embodiment 10

Figure 21:
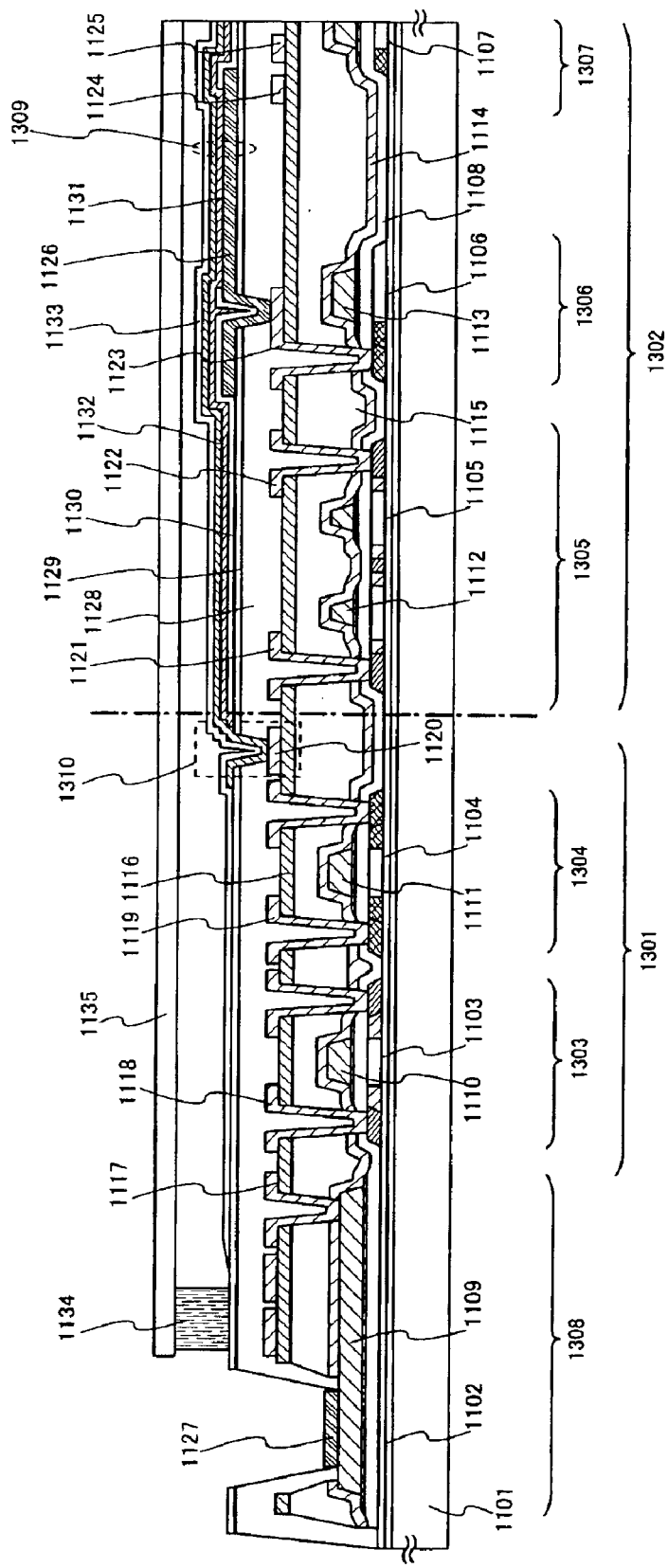
FIG. 21 shows a cross-sectional view illustrating a pixel structure of a display device using a TFT produced in accordance with the invention.
Figure 22:
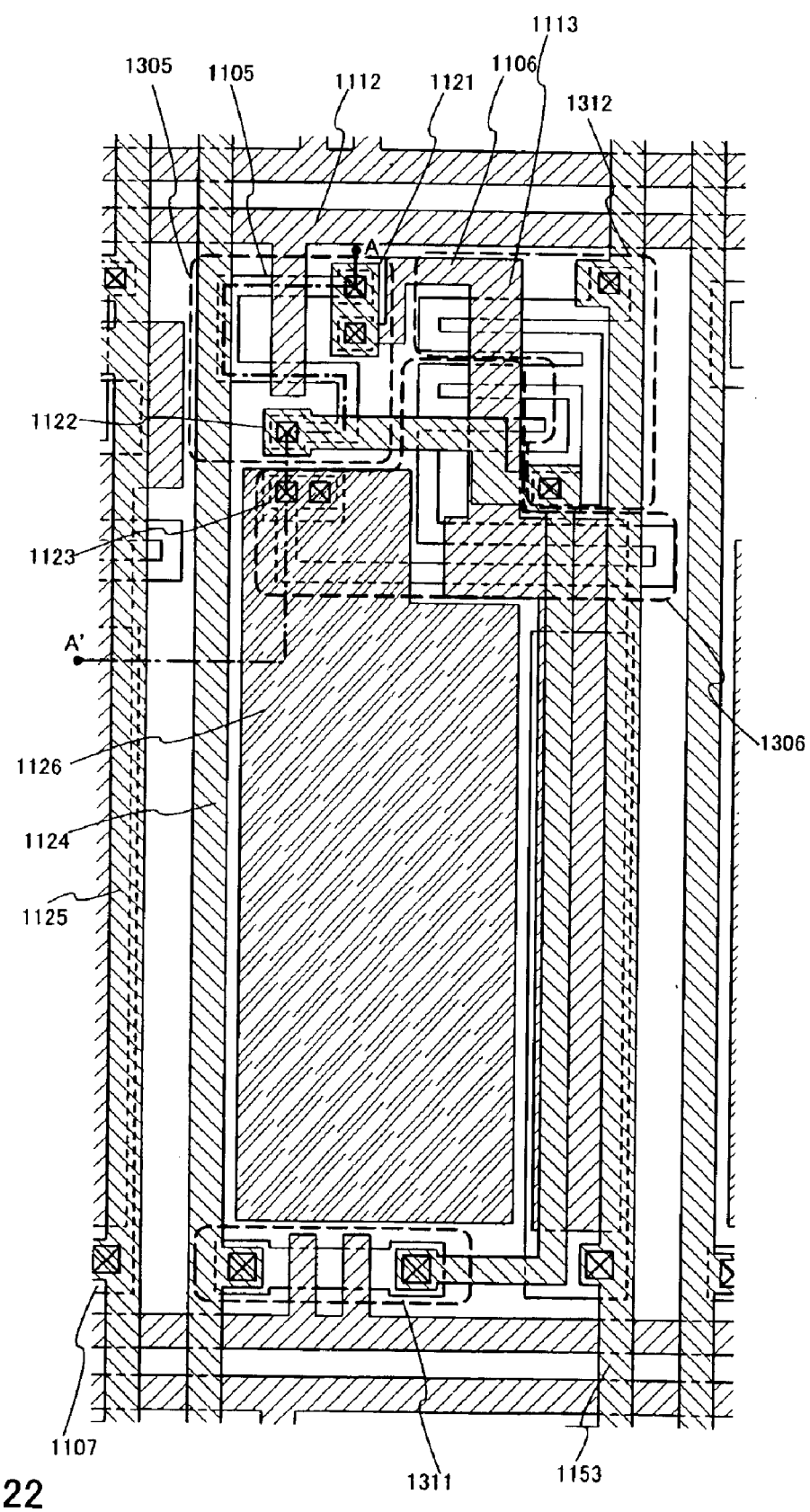
FIG. 22 shows a top view illustrating a pixel structure of a displaying device using a TFT produced in accordance with the invention.

FIG. 21 shows an example of a structure of an active-matrix driving type of displaying device in which a light emitting element is provided in each pixel. Using a TFT produced in Embodiment 9, can be formed a pixel portion 1302 and a driving circuit portion 1301 provided in the vicinity of the pixel portion 1302. FIG. 22 is a top view showing a structure of the pixel portion thereof. In FIG. 22, the same reference numbers as those in FIG. 21 are marked. A second shape of semiconductor region formed on an insulating surface for forming a channel forming region of a TFT is formed by mean of any of Embodiments 1 to 8 appropriately.

A glass substrate or an organic resin substrate is used for a substrate 1101. Organic resin material is lighter in weight than glass material and effective in lightening a light emitting device per se. In manufacturing a light emitting device, organic resin material such as polyimide, polyethylene terephthalate (PET), polyethylene naphthalate (PEN), polyether sulphone (PES) and aramid is applicable. It is preferable to use barium borosilicate glass or alminoborosilicate glass, which is called non-alkali glass, for a glass substrate. A thickness of a glass substrate to be used is 0.5 to 1.1 mm, but it should be thinner for the purpose of lightening. It is desirable to use a glass substrate having small specific gravity of 2.37 g/cc in order to achieve further lightening.

In FIG. 21, is shown a structure in which an n-channel type of TFT 1303 and a p-channel type of TFT 1304 are formed in a driving circuit portion 1301, while a first TFT 1305 consisting of an n-channel type of TFT and a fourth TFT 1306 consisting of a p-channel type of TFT are formed in a pixel portion 1302. In this structure, the fourth TFT 1306 is connected to a light emitting element 1309.

These TFTs comprise a second shape of semiconductor regions 1103 to 1107, a gate insulating film 1108 and gate electrodes 1110 to 1113 on a blocking layer 1102 made of silicon nitride or silicon oxide nitride. A first insulating layer 1114 made of silicon nitride or silicon oxide nitride including hydrogen is formed on the gate electrode to function together with the blocking layer 1102 as a protection film for preventing impurities such as moisture or metal from spreading over and contaminating the second shape of semiconductor region.

A second insulating layer 1115, which is selected from organic resin material such as polyimide, polyamide, polyimide-amide, acrylic and BCB, is formed on the first insulating layer 1114 into a thickness of 0.5 to 1 μm as a flatting film. The second insulating layer 1115 is formed in firing after the organic compounds are applied by means of spin application method. Organic insulating body material is absorbent and has a characteristic of storing moisture. When the stored moisture is emitted again, it supplies the organic compounds of a light emitting element formed on the top layer portion with oxygen to cause deterioration of the light emitting element. A third insulating layer 1116 is formed on the second insulating layer 1115 into a thickness of 50 to 200 nm for the purpose of preventing moisture from being stored and emitted again. The third insulating layer 1116 should be a fine film in view of adhesiveness with a ground and a barrier characteristic. It is preferably formed by means of inorganic insulating material selected from silicon nitride, silicon oxide nitride, aluminum oxide nitride and aluminum nitride in sputtering method.

In the case of silicon nitride produced in sputtering method in which nitrogen is only used as a sputtering gas while silicon is used as a target, it is enough to have a film thickness of 10 to 100 nm, preferably, 20 to 40 nm. This sputtering method can be considered to have a reactive mechanism close to so-called reactive sputtering in which parent material of a target is not only scattered by means of diluted gas ion, but a surface of the target is nitrided to be adhered to a substrate. It is thus characterized that the mechanism allows a silicon nitride film finer than the case that silicon nitride is used as a target to be formed even at a room temperature. Similarly, a thickness should be 40 nm or more in the case of aluminum oxide nitride film produced in the sputtering method.

After the above, a contact hole is formed to form wirings 1117 to 1125. A fourth insulating layer 1128 is then formed of organic resin material especially in a pixel region in order to eliminate inequality of a surface due to the contact hole and the wirings. A fifth insulating layer 1129 consisting of a silicon nitride film is formed in the sputtering method on the organic resin material 1128 since the material 1128 is absorbent. The fourth insulating layer 1128 is not only formed in the pixel portion 1302 but extends to the driving circuit portion 1301. It also has a function as a layer insulating film when it is formed over the wirings 1117 to 1125.

A light emitting element 1309 is formed on the fifth insulating layer 1129. In a displaying device having a structure that a light is emitted through a substrate 1101, an ITO (indium tin oxide) layer is formed on the fifth insulating layer 1129 as an anode layer 1126. Zinc oxide or gallium may be added to ITO for the purpose of flattening and resistance lowering. The wiring 1123 is electrically connected to the anode layer 1126 through a contact hole in the pixel portion.

A protection insulating film 1130 is provided for preventing a light emitting element from short-circuiting due to inequality caused by an end of the anode layer 1126 formed in every pixel portion and a contact hole. The protection insulating film 1130 can consist of a silicon oxide film, a silicon nitride film or a silicon oxide nitride film. In the protection insulating film 1130, the organic insulating body material is first formed into a thickness of 0.5 to 2 μm over the whole surface, and then, an aperture is formed in accordance with the anode layer 1126.

The light emitting element 1309 consists of the anode layer 1126, a cathode layer 1132 including alkaline metal or alkaline earth metal and an organic compounds layer 1131 including a light emitting layer therebetween. The organic compounds layer 1131 including a light emitting layer comprises one or plurality layers piled. Each layer is distinctively called a hole injection layer, a hole carrying layer, a light emitting layer, an electron carrying layer and an electron injection layer in accordance with respective purposes and functions. These layers can be formed by means of any one of or all of small molecule organic compounds material, middle molecule organic compounds material and polymer-based organic compounds material appropriately in combination. Further, it is possible to form a mixed layer in which an electron carrying material and hole carrying material are mixed appropriately or mixed junction in which a mixed region is formed on each junction surface. It is, of course, also possible to provide a pixel structure in which an anode and a cathode are reversed.

The cathode layer 1132 consists of alkaline metal or alkaline earth metal having a small work function. Material including magnesium (Mg), lithium (Li) or calcium (Ca) is used for the cathode layer 1132. It is preferable to use an electrode made of MgAg (material formed by mixing Mg and Ag at a ratio of Mg:Ag =10:1). Further, an MgAgAl electrode, an LiAl electrode and an LiFAl electrode can also be used as other than the above. Moreover, the cathode layer 1132 can be formed by combining fluoride such as alkaline metal or alkaline earth metal and low resistance metal such as aluminum. The cathode layer 1132 is formed across plural pixels as a common electrode and is connected to a wiring 1120 outside the pixel portion 1302 or between the pixel portion 1302 and the driving circuit portion 1301 to be led to an outer terminal.

In order to improve airtightness, a sixth insulating layer 1133 may be formed on the above cathode layer 1132 by means of material selected from silicon nitride, diamond like carbon (DLC), aluminum oxide nitride, aluminum oxide and aluminum nitride. Especially, a DLC layer is known for its high characteristic in gas barrier for oxygen, CO, $Co_2$, $H_2O$ and so on. A fifth inorganic insulating layer is desirably formed continuously after a cathode 131 is formed, without exposed to the air. A buffer layer made of silicon nitride may be provided under the fifth inorganic insulating layer to improve adhesiveness. It is also possible to form, on an interface between the anode layer 1126 and the organic compounds layer 1131 including a light emitting layer, an inorganic insulating layer having a thickness of 0.5 to 5 nm so that a tunnel current can flow, although the inorganic insulating layer is not shown in the drawings. The inorganic insulating layer is effective in prevention of short circuit caused by inequality of a surface of the anode and in restraining dispersion of alkaline metal used for a cathode to a lower layer side.

In FIG. 21, a first TFT 1305 has a multi-gate structure and a low density drain (LDD) is provided to reduce an off current. The fourth TFT 1306 is provided with an LDD overlapping a gate electrode. A TFT using polycrystalline silicon is easily deteriorated due to hot carrier effect since it shows a high operating speed. Therefore, it is greatly effective in manufacturing a displaying device having a high reliability and capable of good image display (having a high operating function) to form in a pixel a TFT having different structure in accordance with a function (a switching TFT having a completely low off current and a current controlling TFT having a high resistance to hot-carrier injection), as shown in FIG. 21. FIG. 22 shows a top view of the pixel portion. In FIG. 22, almost one pixel structure is shown, which comprises a first TFT 1305, a second TFT 1311, a third TFT 1312, a fourth TFT 1306 and a capacitive portion 1312. A diagram of an equivalent circuit is shown in FIG. 24.

The structure shown in the drawing is, of course, only an example and does not form a requirement for constructing the invention.

A circuit structure of a driving circuit portion 1301 is omitted here although a gate signal side driving circuit is different from a data signal side driving circuit. An n-channel type of TFT 1303 and a p-channel type of TFT 1304 are connected to wirings 1118 and 1119. Using these TFTs, a shift resistor, a latch circuit and/or a buffer circuit can be formed.

An input terminal portion 1308 is formed by means of a wiring formed in the same layer with a gate electrode or a wiring formed on a third insulating layer 1116. FIG. 21 shows an example of forming an input terminal portion in the same layer with a gate electrode. In FIG. 21, the input terminal portion consists of conductive layers 1109 and 1127. The conductive layer 1127 is to be formed simultaneously with an anode layer 1126 and is made of oxide conductive material. Covering a portion practically exposed on a surface with the oxide conductive material prevents a surface resistance due to oxidation reaction from increasing.

An adhesive resin 1134 is filled in the aperture and in the vicinity thereof to fix a sealing substrate 1135. Metals such as stainless steel and aluminum can be used for the sealing substrate 1135. A glass substrate may be also used. An inner part enclosed by the adhesive resin 1134 and the sealing substrate 1135 can be filled with a drier such as barium oxide to be sealed in order to prevent deterioration due to moisture. The sealing substrate may be formed by organic resin material having a thickness of around 0 to 120 μm so as to be flexible. A cover film consisting of inorganic insulating body such as DLC and silicon nitride may be formed on a surface of the sealing substrate as a gas barrier layer. An example of material used for a sealing pattern is epoxy adhesive. Further covering side portions with a cover film consisting of inorganic insulating body can prevent steam from penetrating from the side portions.

For an adhesive resin 1134, can be used a UV-curing type of acrylic resin or a cation UV-curing type of epoxy resin.

Accordingly, a TFT is combined with a light emitting element to form a pixel portion, and then, a displaying device can be completed. In such a displaying device, a driving circuit can be formed on the same substrate, using a TFT. As shown in FIG. 21, enclosing a lower layer and an upper layer of a semiconductor film, a gate insulating film and a gate electrode, which are main elements of a TFT, with a blocking layer made of silicon nitride or silicon oxide nitride and a protection film offers a structure capable of preventing alkaline metal and organics from being contaminated. On the other hand, a light emitting element partially includes alkaline metal and is enclosed by a protection film consisting of a silicon nitride, silicon oxide nitride or DLC film and a gas barrier layer consisting of an insulating film including silicon nitride or carbon as a main component. This offers a structure capable of preventing oxygen or moisture from entering from the outside.

Embodiment 11

The invention can be applied for various electronic devices. The semiconductor devices include a mobile information terminal (an electronic note, a mobile computer, a cellular phone and so on), a video camera, a digital camera, a personal computer, a television set and a projection type of display apparatus. Examples are shown in FIGS. 25A to 25G and 26A to 26D.

Figure 25A:
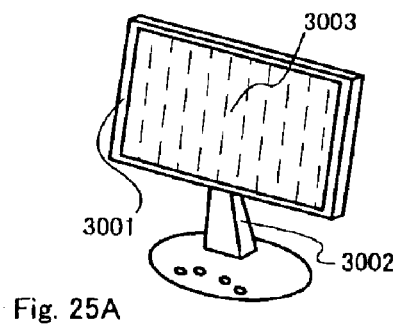
FIGS. 25A to 25G show examples of an electronic device.

FIG. 25A is a television set as an example according to the invention, and the television set is constituted by a housing 3001, a support 3002 and a display portion 3003. A produced TFT substrate according to the invention is applied to the display portion 3003, and the television set can be completed by the invention.

Figure 25B:
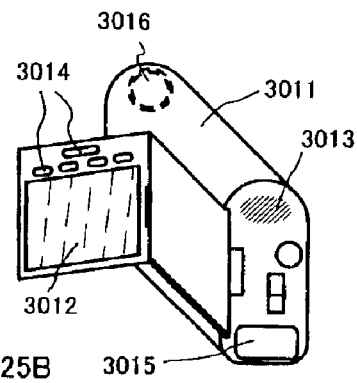

FIG. 25B is a video camera as an example according to the invention, and the video camcorder is constituted by a body 3011, a display portion 3012 and a sound input portion 3013, operating switches 3014, a battery 3015 and an image receiving portion 3016. A produced TFT substrate according to the invention is applied to the display portion 3012, and the video camera can be completed by the invention.

Figure 25C:
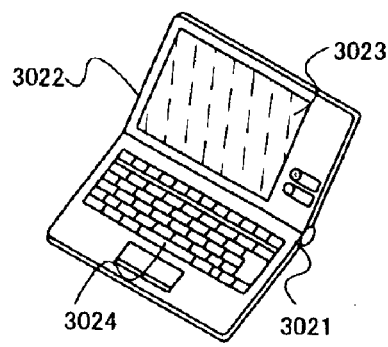

FIG. 25C is a note type of personal computer as an example according to the invention, and the personal computer is constituted by a body 3021, a support 3022, a display portion 3023 and a keyboard 3024. A produced TFT substrate according to the invention is applied to the display portion 3023, and the personal computer can be completed by the invention.

Figure 25D:
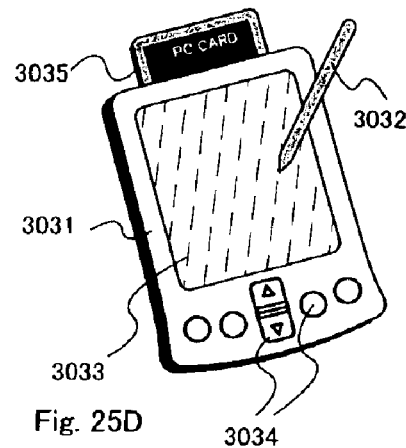

FIG. 25D is a PDA (Personal Digital Assistant) as an example according to the invention, and the PDA is constituted by a body 3031, a stylus 3032, a display portion 3033, operating buttons 3034 and an external interface 3035. A produced TFT substrate according to the invention is applied to the display portion 3033, and the PDA can be completed by the invention.

Figure 25E:
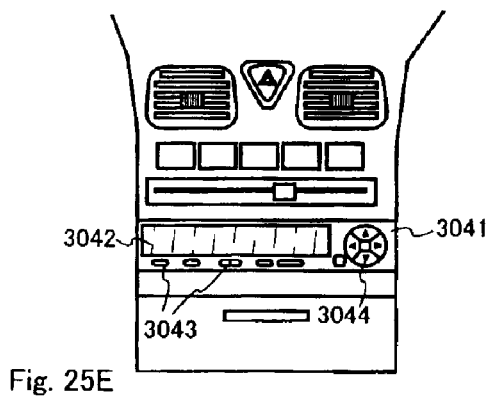

FIG. 25E is a sound reproducing system, concretely an on-vehicle audio system as an example according to the invention, and the audio system includes a body 3041, a display portion 3042 and operating switches 3043 and 3044. A produced TFT substrate according to the invention is applied to the display portion 3042, and the audio system can be completed by the invention.

Figure 25F:
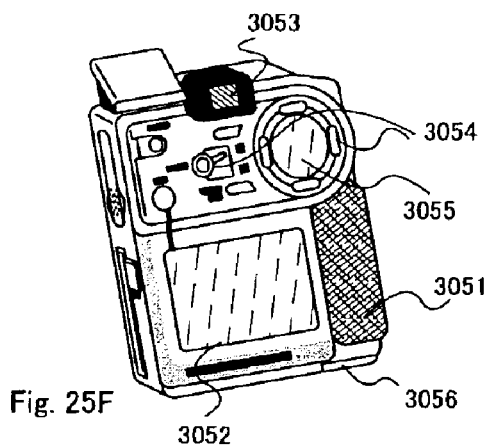

FIG. 25F is a digital camera as an example according to the invention, and the digital camera is constituted by a body 3051, a display portion A 3052 and an eyepiece portion 3053, operating switches 3054, a display portion B 3055 and a battery 3056. A produced TFT substrate according to the invention is applied to the display portion A 3052 and the display portion B 3055, and the digital camera can be completed by the invention.

Figure 25G:
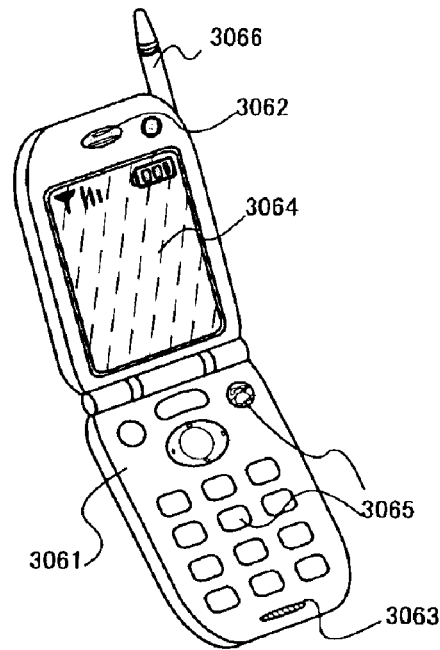

FIG. 25G is a cellular phone as an example according to the invention, and the cellular phone is constituted by a body 3061, a sound output portion 3062, a sound input portion 3063, a display portion 3064, operating switches 3065 and an antenna 3066. A produced TFT substrate according to the invention is applied to the display portion 3064, and the cellular phone can be completed by the invention.

Figure 26A:
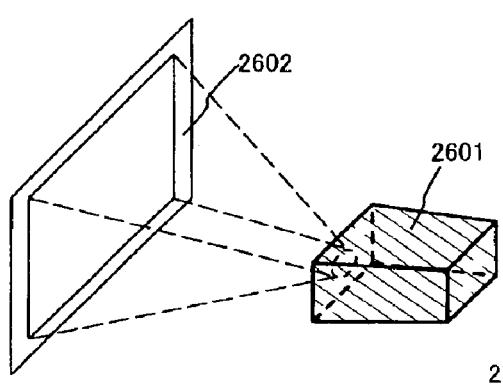
FIGS. 26A to 26D show examples of a projector.
Figure 26B:
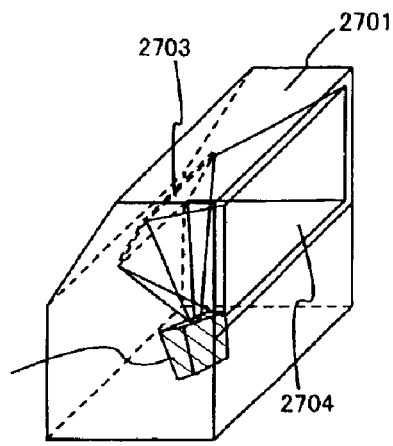

FIG. 26A is a front type of projector, which includes a projection apparatus 2601 and a screen 2602. FIG. 26B is a rear type of projector, which includes a body 2701, a projection apparatus 2702, a mirror 2703 and a screen 2704.

Figure 26C:
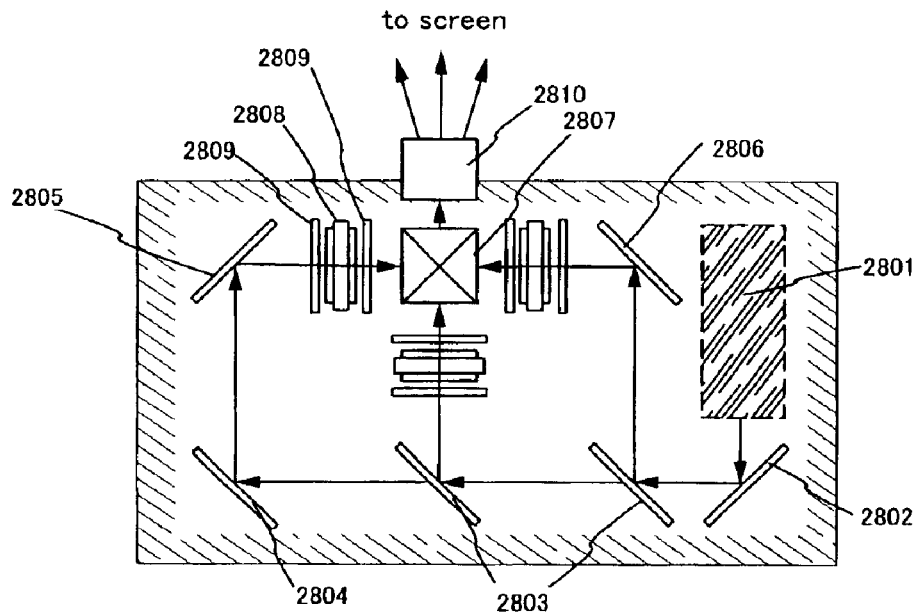

FIG. 26C shows an example of configuration of the projection apparatuses 2601 and 2702 illustrated in FIG. 26A and FIG. 26B. The projection apparatuses 2601 and 2702 are constituted by a light source optical system 2801, mirrors 2802 and 2804 to 2806, a dichroic mirror 2803, a prism 2807, a liquid crystal display apparatus 2808, a phase difference plate 2809 and projection optical system 2810. The projection optical system 2810 is constituted by an optical system including a projection lens. A single plate method may be applicable. Though the example of three plates is shown in the embodiment, there is no particular limitation.

Figure 26D:
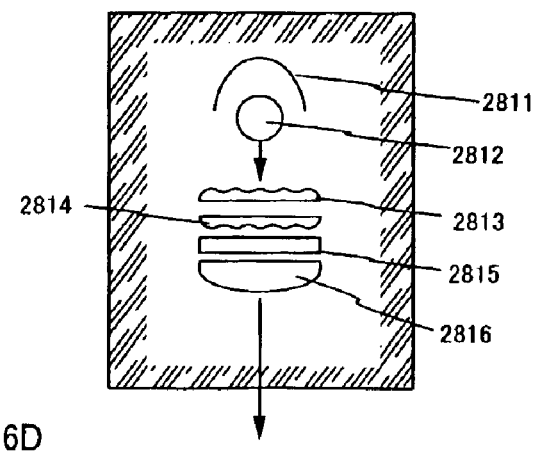

FIG. 26D shows an example of configuration of the light source optical system 2801 illustrated in FIG. 26C. In the embodiment, the light source optical system 2801 includes a reflector 2811, a light source 2812, lens arrays 2813 and 2814, a polarization conversion element 2815 and a condenser lens 2816. The light source optical system shown in FIG. 26D is an example, however there is no particular limitation. An optical system such as an optical lens, a film having polarization function, a film adjusting phase difference and an IR film may be properly provided in the light source optical system.

Electronic apparatus illustrated in this specification is an example, therefore the invention is applicable particularly, but not exclusively, to those examples.

As described above, in accordance with the invention, crystallization using a first shape of semiconductor region in which a plurality of semiconductor regions having on its one side a sharp convex top-end portion is disposed in parallel is performed by irradiation with a continuous wave laser beam, so that a crystal first formed in a seed region, which becomes a core, would grow. Growth of the core of the crystal is then confined to have an effect of reducing core generating density as well as confining orientation of a crystal, so that a crystal having a specific orientation can be grown. Arranging a region to consist of a crystal extending from a plurality of sharp convex top-end portions so as to eliminate a grain boundary extended from a concave portion or a distortion-accumulated crystal allows a TFT to be formed only with a good crystal.

In accordance with such a structure, a plurality of rectangular semiconductor regions are provided in parallel between a pair of source and drain regions to form a transistor, so that dispersion of a characteristic between elements can be made small. Further, only using good crystals can improve mobility of field effect.

What is claimed is:

1. A method of manufacturing a semiconductor device comprising:

forming a first shape of semiconductor region on an insulating surface, the first shape of semiconductor region having on one side thereof a plurality of sharp convex top-end portions;

scanning the first shape of semiconductor region from the plurality of convex top-end portions to another end portion opposing thereto with a continuous wave laser beam; and etching the first shape of semiconductor region to form a second shape of semiconductor region in which a channel forming region and a source and drain region are formed;

wherein, in the second shape of semiconductor region, a plurality of rectangular semiconductor regions are disposed so that a channel forming region is formed in respective crystal regions extending from the plurality of convex top-end portions; and wherein the etching process is performed so that a portion of the first shape of semiconductor region adjacent to the channel forming region is removed.

2. The method of manufacturing a semiconductor device according to claim 1, wherein the continuous wave laser beam has strength dispersion such that there is an even region in a longitudinal direction while it disperse in a lateral direction.

3. The method of manufacturing a semiconductor device according to claim 1, wherein a light source of the continuous wave laser beam is a rectangular beam solid laser oscillator device.

4. The method of manufacturing a semiconductor device according to claim 1, wherein a light source of the continuous wave laser beam is a slab laser oscillator device.

5. The method of manufacturing a semiconductor device according to claim 1, wherein an interval between the adjacent rectangular semiconductor regions is twice or more the length in a channel width direction of the rectangular semiconductor regions.

6. The method of manufacturing a semiconductor device according to claim 1, wherein a length of one rectangular semiconductor region in channel width direction is 0.5 to 1.0 μm.

7. The method of manufacturing a semiconductor device according to claim 1, wherein an LDD region is formed in the rectangular semiconductor region.

8. A method of manufacturing a semiconductor device comprising:

forming a first shape of semiconductor region on an insulating surface, the first shape of semiconductor region having on one side thereof a plurality of sharp convex top-end portions;

scanning the first shape of semiconductor region from the plurality of convex top-end portions to another end portion opposing thereto with a plurality of continuous wave laser beams linearly condensed on an irradiation surface; and etching the first shape of semiconductor region to form a second shape of semiconductor region in which a channel forming region and a source and drain region are formed, wherein, in the second shape of semiconductor region, a plurality of rectangular semiconductor regions are disposed so that a channel forming region is formed in respective crystal regions extending from the plurality of convex top-end portions, and wherein the etching process is performed so that a portion of the first shape of semiconductor region adjacent to the channel forming region is removed.

9. The method of manufacturing a semiconductor device according to claim 8, wherein the continuous wave laser beam has strength dispersion such that there is an even region in a longitudinal direction while it disperses in a lateral direction.

10. The method of manufacturing a semiconductor device according to claim 8, wherein a light source of the continuous wave laser beam is a rectangular beam solid laser oscillator device.

11. The method of manufacturing a semiconductor device according to claim 8, wherein a light source of the continuous wave laser beam is a slab laser oscillator device.

12. The method of manufacturing a semiconductor device according to claim 8, wherein an interval between the adjacent rectangular semiconductor regions is twice or more the length in a channel width direction of the rectangular semiconductor regions.

13. The method of manufacturing a semiconductor device according to claim 8, wherein a length of one rectangular semiconductor region in a channel width direction is 0.5 to 1.0 μm.

14. The method of manufacturing a semiconductor device according to claim 8, wherein an LDD region is formed in the rectangular semiconductor region.

15. The method of manufacturing a semiconductor device according to claim 8, further comprising forming an electrode over the second shape of semiconductor through an insulating film therebetween and the electrode is applied with common potential.

16. A method of manufacturing a semiconductor device comprising:

forming a first shape of semiconductor region on an insulating surface wherein the first shape of semiconductor region comprises a plurality of semiconductor regions each having on one aide thereof a sharp convex top-end portion and the plurality of semiconductor regions arc disposed in parallel;

scanning the first shape of semiconductor region from each of the convex top-end portions to another end portion opposing thereto with a continuous wave laser beam; and etching the first shape of semiconductor region to form a second shape of semiconductor region in which a channel forming region and a source and drain region are formed, wherein, in the second shape of semiconductor region, a plurality of rectangular semiconductor regions are disposed so that a channel forming region is formed in respective crystal regions extending from each of the convex top-end portions, and wherein the etching process is performed so that a portion of the first shape of semiconductor region adjacent to the channel forming region is removed.

17. The method of manufacturing a semiconductor device according to claim 16, wherein the continuous wave laser beam has strength dispersion such that there is an even region in a longitudinal direction while it disperses in a lateral direction.

18. The method of manufacturing a semiconductor device according to claim 16, wherein a light source of the continuous wave laser beam is a rectangular beam solid laser oscillator device.

19. The method of manufacturing a semiconductor device according to claim 16, wherein a light source of the continuous wave laser beams is a slab laser oscillator device.

20. The method of manufacturing a semiconductor device according to claim 16, wherein an interval between the adjacent rectangular semiconductor regions is twice or more the length in a channel width direction of the rectangular semiconductor region.

21. The method of manufacturing a semiconductor device according to claim 16, wherein a length of one rectangular semiconductor region in a channel width direction is 0.5 to 1.0 µm.

22. The method of manufacturing a semiconductor device according to claim 16, wherein an LDD region is formed in the rectangular semiconductor region.

23. The method of manufacturing a semiconductor device according to claim 16, further comprising forming an electrode over the second shape of semiconductor region through an insulating film and the electrodes applied with common potential.

24. A method of manufacturing a semiconductor device comprising:

forming a first shape of semiconductor region on an insulating surface wherein the first shape of semiconductor region comprises a plurality of semiconductor or regions each having on one side thereof a sharp convex top-end portion and the plurality of semiconductor regions are disposed in parallel;

scanning the first shape of semiconductor region from each of the convex top-end portions to another end portion opposing thereto with a plurality of continuous wave laser beams linearly condensed on an irradiation surface; and etching the first shape of semiconductor region to form a second shape of semiconductor region in which a channel forming region and a source and drain region are formed, wherein, in the second shape of semiconductor region, a plurality of rectangular semiconductor regions are disposed so that a channel forming region is formed in respective crystal regions extending from each of the convex top-end portions; and wherein the etching process is performed so that a portion of the first shape of semiconductor region adjacent to the channel forming region is removed.

25. The method of manufacturing a semiconductor device according to claim 24, wherein the continuous wave laser beam has strength dispersion such that there is an even region in a longitudinal direction while it disperses in a lateral direction.

26. The method of manufacturing a semiconductor device according to claim 24, wherein a light source of the continuous wave laser beam is a rectangular beam solid laser oscillator device.

27. The method of manufacturing a semiconductor device according to claim 24, wherein a light source of the continuous wave laser beam is a slab laser oscillator device.

28. The method of manufacturing a semiconductor device according to claim 24, wherein an interval between the adjacent rectangular semiconductor regions is twice or more the length in a channel width direction of the rectangular semiconductor region.

29. The method of manufacturing a semiconductor device according to claim 24, wherein a length of one rectangular semiconductor region in a channel width direction is 0.5 to 1.0 µm.

30. The method of manufacturing a semiconductor device according to claim 24, wherein an LDD region is formed in the rectangular semiconductor region.

31. The method of manufacturing a semiconductor device according to claim 24, further comprising forming an electrode over the second shape of semiconductor region through an insulating film and the electrodes applied with common potential.

* * * * *